(12) United States Patent
Williams et al.

(10) Patent No.: US 11,079,528 B2
(45) Date of Patent: Aug. 3, 2021

(54) POLARIZER NANOIMPRINT LITHOGRAPHY

(71) Applicant: Moxtek, Inc., Orem, UT (US)

(72) Inventors: Bradley R. Williams, Pocatello, ID (US); R. Stewart Nielson, Pleasant Grove, UT (US); Anubhav Diwan, Provo, UT (US); Eric Gardner, Eagle Mountain, UT (US); Shaun Patrick Ogden, Saratoga Springs, UT (US); Bob West, Orem, UT (US)

(73) Assignee: Moxtek, Inc., Orem, UT (US)

( * ) Notice: Subject to any disclaimer, the term of this patent is extended or adjusted under 35 U.S.C. 154(b) by 259 days.

(21) Appl. No.: 16/366,932

(22) Filed: Mar. 27, 2019

(65) Prior Publication Data

US 2019/0317260 A1 Oct. 17, 2019

Related U.S. Application Data

(60) Provisional application No. 62/656,759, filed on Apr. 12, 2018.

(51) Int. Cl.
| | |
|---|---|
| *G02B 5/30* | (2006.01) |
| *G03F 7/00* | (2006.01) |
| *B29D 11/00* | (2006.01) |
| *G03F 7/20* | (2006.01) |
| *B82Y 40/00* | (2011.01) |

(52) U.S. Cl.
CPC ........ *G02B 5/3041* (2013.01); *B29D 11/0073* (2013.01); *B29D 11/00644* (2013.01); *G02B 5/3058* (2013.01); *G03F 7/0002* (2013.01); *G03F 7/70566* (2013.01); *B82Y 40/00* (2013.01)

(58) Field of Classification Search
CPC .......... B29D 11/00644; B29D 11/0073; G02B 5/3041; G02B 5/3058; G03F 7/70566; G03F 7/0002
See application file for complete search history.

(56) References Cited

U.S. PATENT DOCUMENTS

| | | |
|---|---|---|
| 6,288,840 B1 | 8/2001 | Perkins et al. |
| 6,665,119 B1 | 12/2003 | Kurtz et al. |
| 8,873,144 B2 | 10/2014 | Davis |
| 8,913,320 B2 | 12/2014 | Davis et al. |
| 9,703,028 B2 | 7/2017 | Linford et al. |
| 9,726,897 B2 | 8/2017 | Huang et al. |

(Continued)

FOREIGN PATENT DOCUMENTS

| | | |
|---|---|---|
| EP | 1909121 | 4/2008 |
| EP | 2194075 | 6/2010 |

(Continued)

*Primary Examiner* — Mathieu D Vargot
(74) *Attorney, Agent, or Firm* — Thorpe, North & Western, LLP

(57) ABSTRACT

A method of making a polarizer can include applying a liquid with solid inorganic nanoparticles dispersed throughout a continuous phase, then forming this into a different phase including a solid, interconnecting network of the inorganic nanoparticles. This method can improve manufacturability and reducing manufacturing cost. This method can be used to provide an antireflective coating, to provide a protective coating on polarization structures, to provide thin films for optical properties, or to form the polarization structures themselves.

20 Claims, 16 Drawing Sheets

(56) References Cited

U.S. PATENT DOCUMENTS

Figure 1:
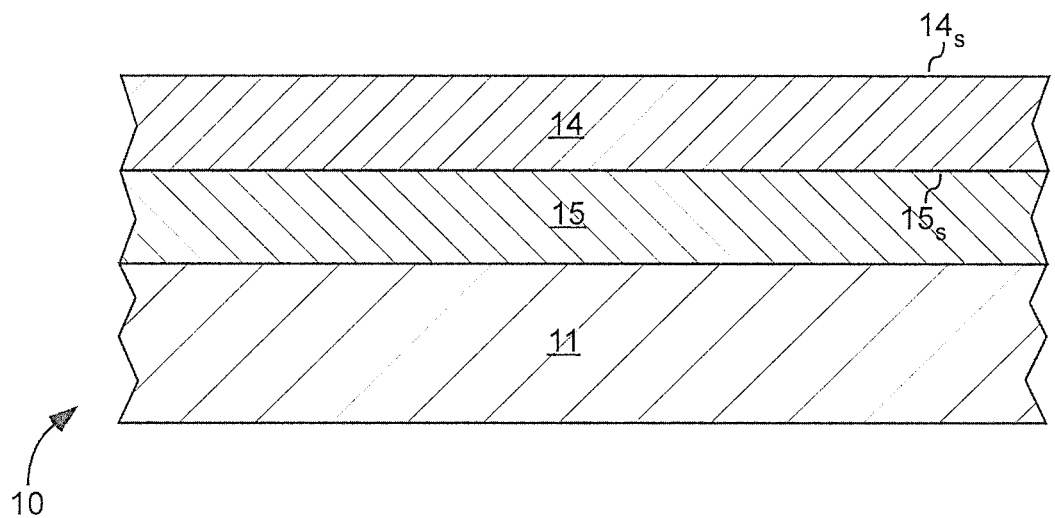

| | | |
|---|---|---|
| 10,139,536 B2 | 11/2018 | Wang et al. |
| 10,139,537 B2 | 11/2018 | Nielson et al. |
| 10,234,613 B2 | 3/2019 | Wangensteen et al. |
| 2003/0031438 A1* | 2/2003 | Kambe .................... G02B 1/02 385/122 |
| 2007/0297052 A1 | 12/2007 | Wang et al. |
| 2009/0052029 A1* | 2/2009 | Dai ...................... G02B 5/3008 359/485.02 |
| 2010/0002299 A1 | 1/2010 | Masuda et al. |
| 2010/0103517 A1 | 4/2010 | Davis et al. |
| 2012/0075699 A1 | 3/2012 | Davis et al. |
| 2014/0300964 A1 | 10/2014 | Davis et al. |
| 2017/0068103 A1 | 3/2017 | Huang et al. |
| 2017/0293059 A1 | 10/2017 | Nielson et al. |
| 2017/0315281 A1* | 11/2017 | Suto ........................ G02B 5/32 |
| 2018/0052257 A1 | 2/2018 | Nielson et al. |
| 2018/0217308 A1* | 8/2018 | Nam ................... B42D 25/324 |
| 2019/0032202 A1 | 1/2019 | Diwan et al. |
| 2019/0041564 A1 | 2/2019 | Nielson et al. |

FOREIGN PATENT DOCUMENTS

| | | |
|---|---|---|
| EP | 2615640 | 7/2013 |
| EP | 3208641 | 8/2017 |

\* cited by examiner

POLARIZER NANOIMPRINT LITHOGRAPHY

CLAIM OF PRIORITY

This application claims priority to U.S. Provisional Patent Application No. 62/656,759, filed on Apr. 12, 2018, which is incorporated herein by reference.

FIELD OF THE INVENTION

The present application is related generally to polarizers.

BACKGROUND

A polarizer can divide light into two different polarization states. One polarization state can pass through the polarizer and the other can be absorbed or reflected. The effectiveness or performance of polarizers is based on a very high percent transmission of one polarization (e.g. Tp) and minimal transmission of an opposite polarization (e.g. Ts). It can also be beneficial to have high contrast (e.g. Tp/Ts). Contrast can be improved by increasing transmission of the predominantly-transmitted polarization (e.g. increasing Tp) and by decreasing transmission of the opposite polarization (e.g. decreasing Ts).

A polarizer can be used in an application with high temperatures, such as for example projectors. As projectors decrease in size and increase in brightness due to customer demand, the need for polarizers that can endure a high temperature environment also increases. Selectively-absorptive polarizers are particularly susceptible to damage in high-light-intensity projectors because they absorb a large percent of incident light. Such polarizers typically have wires that include a reflective portion (e.g. aluminum) and an absorptive portion (e.g. silicon). The absorptive portion can absorb about 80% of one polarization of light, and thus about 40% of the total amount of light. Much of the heat from this absorbed light conducts to the reflective portion of the wire, which can melt, thus destroying the polarizer. Thus, it can be a consideration to improve the high temperature durability of selectively-absorptive polarizers.

Ribs or wires of polarizers, especially for polarization of visible or ultraviolet light, can have small, delicate ribs with nanometer-sized pitch, wire-width, and wire-height. Polarizers are used in systems (e.g. projectors, semiconductor inspection tools, etc.) that require high performance. Small defects in the polarizer, such as collapsed ribs, can significantly degrade system performance (e.g. distorted image from a projector). Therefore, it can be a consideration to protect the ribs from physical damage, such as by touching, and from excessive heat to avoid rib melting.

Manufacture of polarizers can be difficult and expensive due to small size of the ribs. Some materials are more difficult to pattern and etch than other materials in the polarizer. Manufacturability and reducing manufacturing cost can be considerations.

Optical properties can be improved by reducing surface roughness of a surface of thin films of the polarizer. Reducing such surface roughness can be a consideration of polarizer manufacture.

SUMMARY

It has been recognized that it would be advantageous to provide a polarizer with high contrast (e.g. Tp/Ts), with high percent transmission of one polarization, that can endure a high temperature, and that is resistant to physical damage. It has also been recognized that it would be advantageous to improve manufacturability and reduce manufacturing cost of such polarizers. It has also been recognized that it can be helpful to reduce surface roughness of a surface of thin films of the polarizer. The present invention is directed to various methods of making polarizers that satisfy these needs. Each embodiment may satisfy one, some, or all of these needs.

The method can comprise (i) applying an uncured imprintable layer on a substrate; (ii) imprinting a pattern of polarization structures in the uncured imprintable layer, wherein a longitudinal dimension of some of the polarization structures extend in a first direction, a longitudinal dimension of other of the polarization structures extend in a second direction, the first direction and the second direction are parallel to the first side of the substrate, and the first direction is a different direction from the second direction; and (iii) curing the uncured imprintable layer into a solid cured printed layer.

In one embodiment, the uncured imprintable layer can be a liquid with solid inorganic nanoparticles dispersed throughout a continuous phase and the cured printed layer can include a solid, interconnecting network of the inorganic nanoparticles. In another embodiment, the uncured imprintable layer can be a colloidal suspension including a dispersed phase and a continuous phase and curing the uncured imprintable layer can include removing the continuous phase to form the solid cured printed layer. In another embodiment, the uncured imprintable layer can be a solution including molecules in a solvent, the solvent including water and an organic liquid, the molecules including metal atoms bonded to reactive groups, where each reactive-group is independently —Cl, —OR$^2$, —OCOR$^2$, or —N(R$^2$)$_2$, and R$^2$ is an alkyl group; and curing can include reacting the molecules to form a solid of the metal atoms interconnected with each other, defining the cured printed layer.

BRIEF DESCRIPTION OF THE DRAWINGS (Drawings Might not be Drawn to Scale)

FIG. 1 is a step 10 in a method of making a polarizer, including a schematic, cross-sectional side-view of a polarization device 15 on a substrate 11 and an overcoat layer 14 on a surface 15$_s$ of the polarization device 15 farthest from the substrate 11, in accordance with an embodiment of the present invention.

Figure 2:
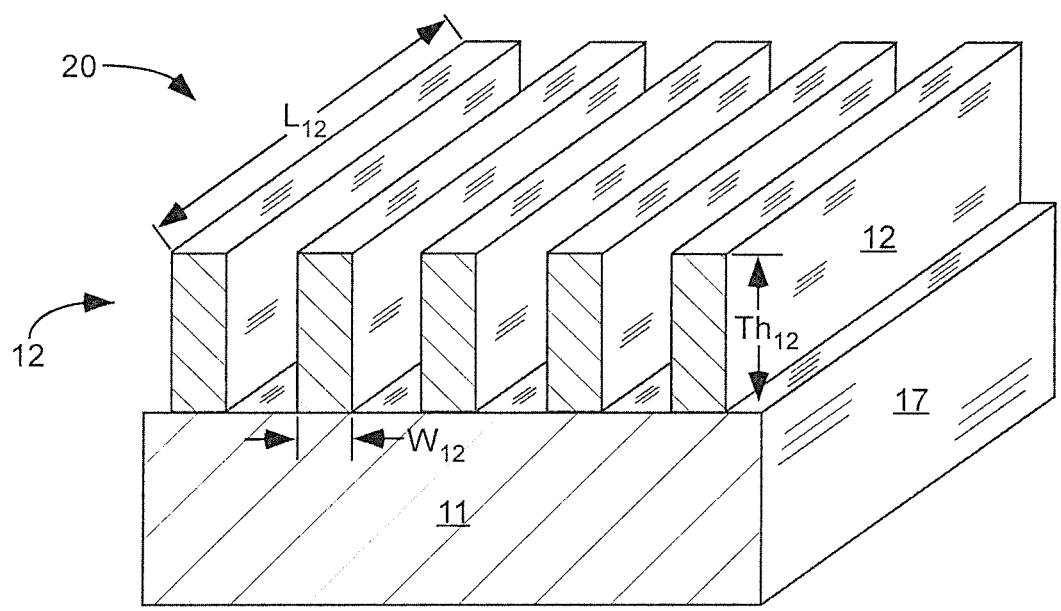

FIG. 2 is a schematic perspective-view of a polarizer 20 with polarization structures 12, which can be an array of wires, on a substrate 11, in accordance with an embodiment of the present invention.

Figure 3:
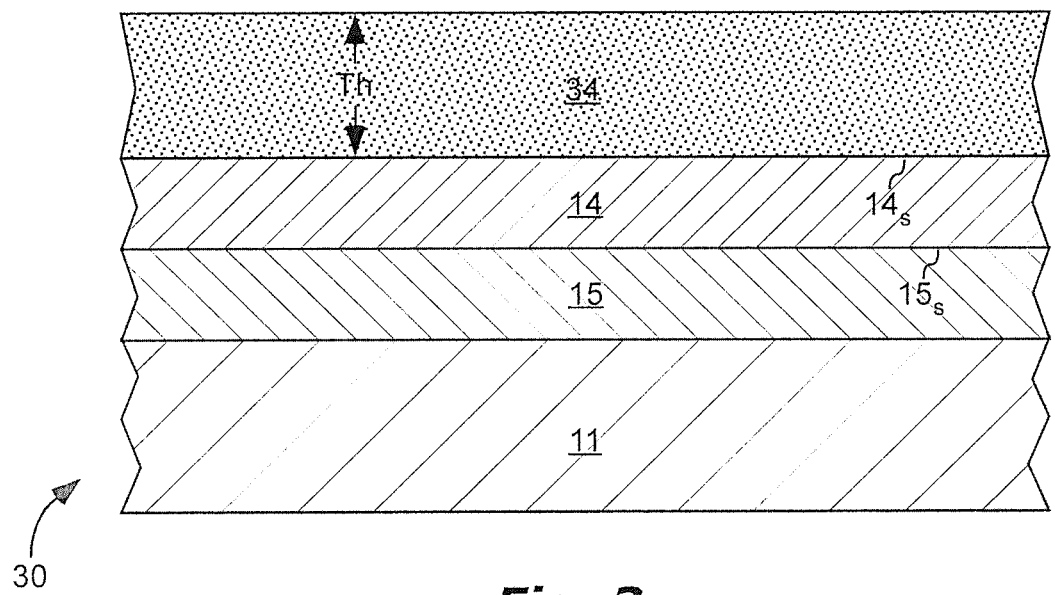

FIG. 3 is a step 30 in a method of making a polarizer, which can follow step 10, including a schematic, cross-sectional side-view of an uncured cover layer 34 on a surface 14$_s$ of the overcoat layer 14 farthest from the polarization device 15, in accordance with an embodiment of the present invention.

Figure 4:
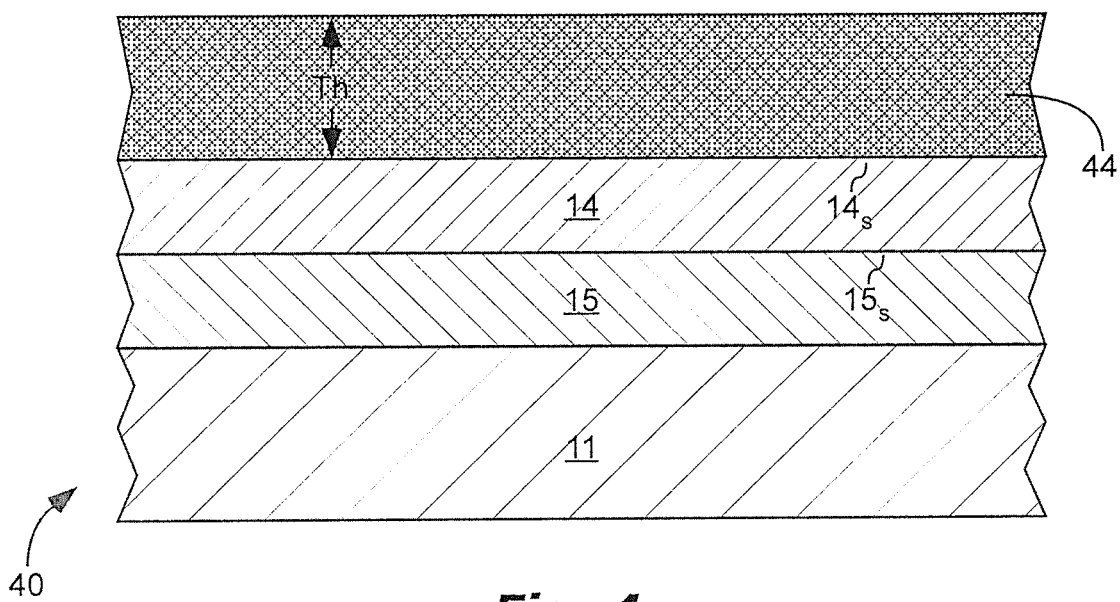

FIG. 4 is a step 40 in a method of making a polarizer, which can follow step 30, including a schematic, cross-sectional side-view of the uncured cover layer 34 formed into a cured cover layer 44, in accordance with an embodiment of the present invention.

Figure 5:
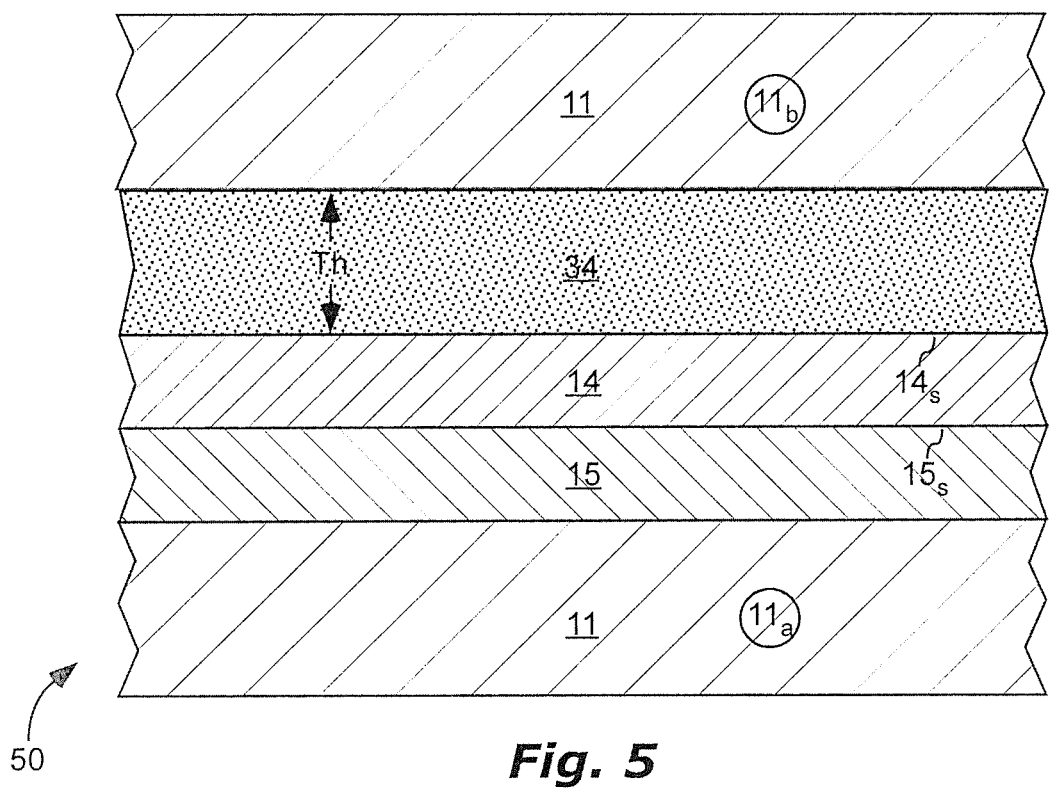

FIG. 5 is a step 50 in a method of making a polarizer, which can follow step 30, including a schematic, cross-sectional side-view of a second substrate 11$_b$ on the uncured cover layer 34, in accordance with an embodiment of the present invention.

Figure 6:
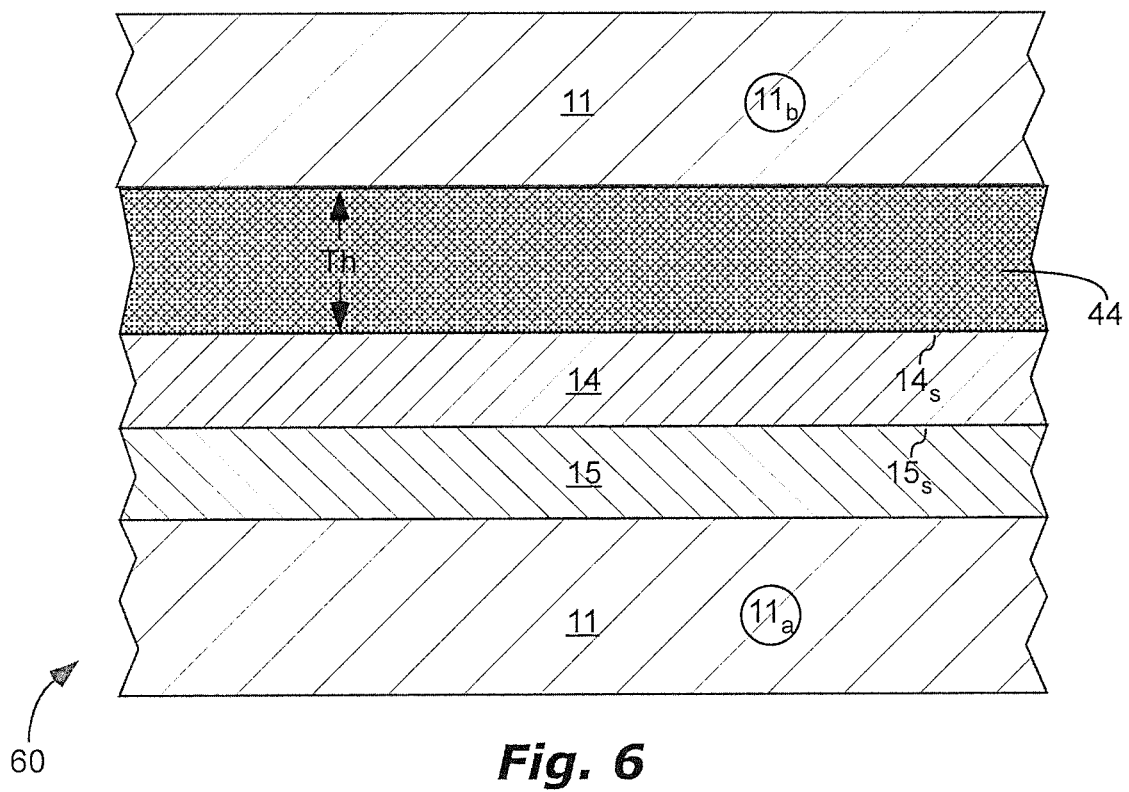

FIG. 6 is a step 60 in a method of making a polarizer, which can follow step 50, including a schematic, cross-sectional side-view of the uncured cover layer 34 formed into a cured cover layer 44, in accordance with an embodiment of the present invention.

Figure 7:
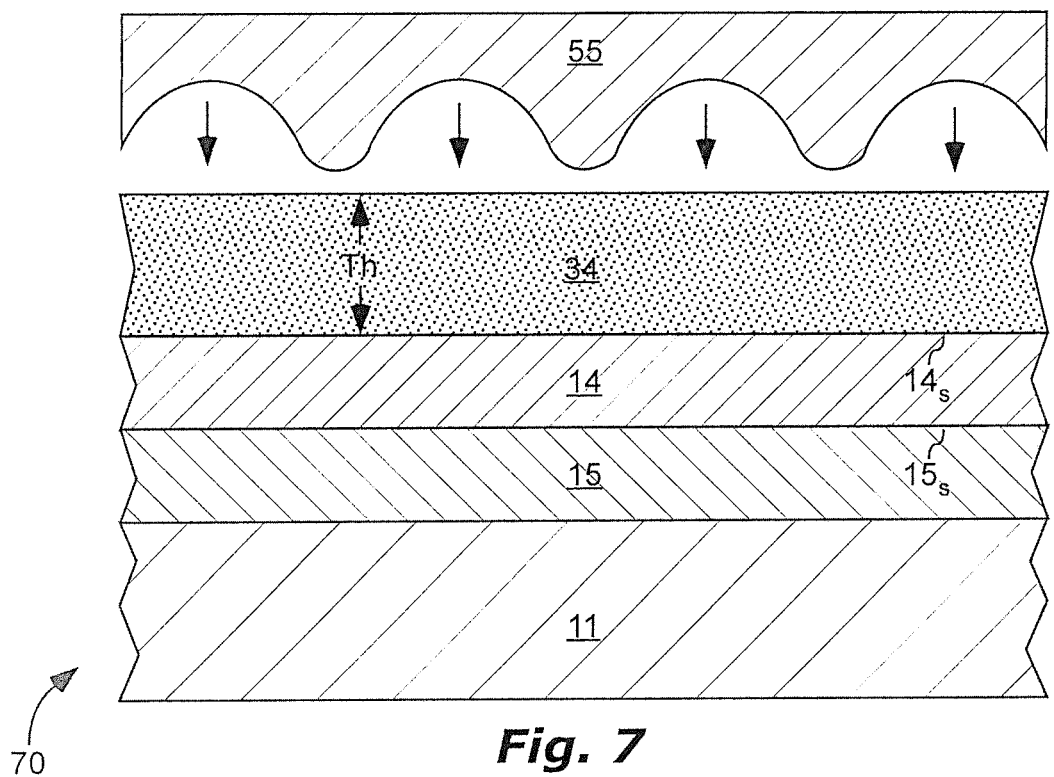
Figure 8:
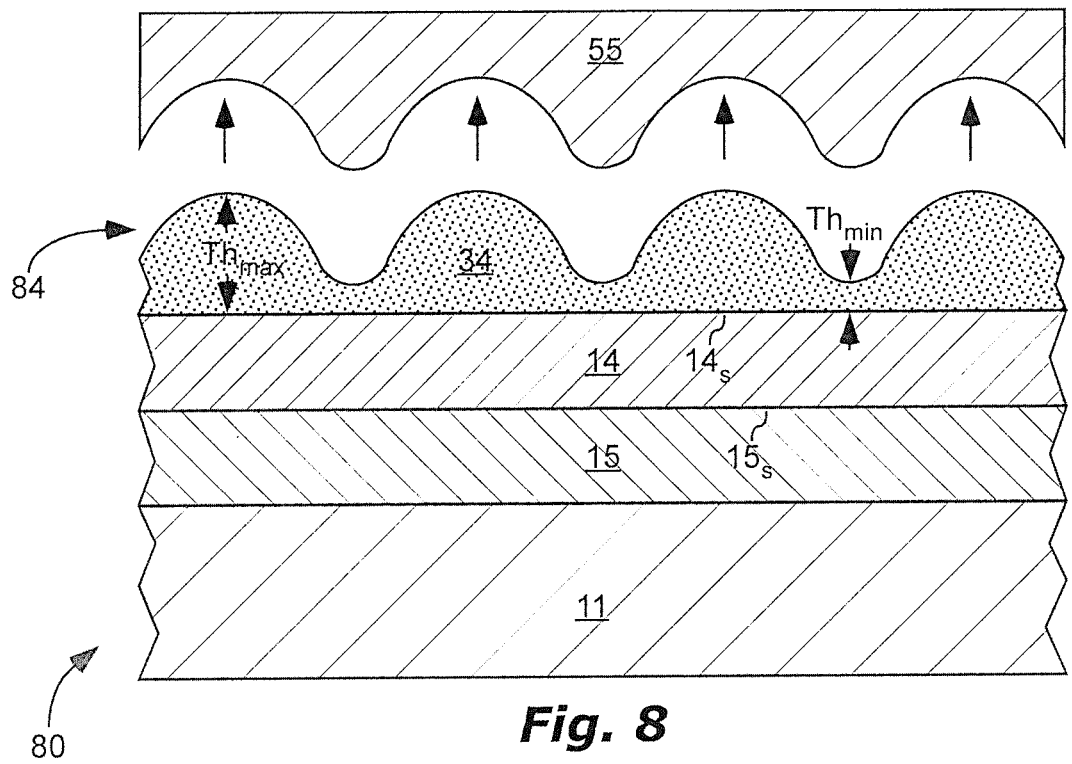

FIGS. 7-8 are steps 70 and 80 in a method of making a polarizer, which can follow step 30, including schematic, cross-sectional side-views of imprinting a pattern of structures 84 in the uncured cover layer 34, in accordance with an embodiment of the present invention.

Figure 9:
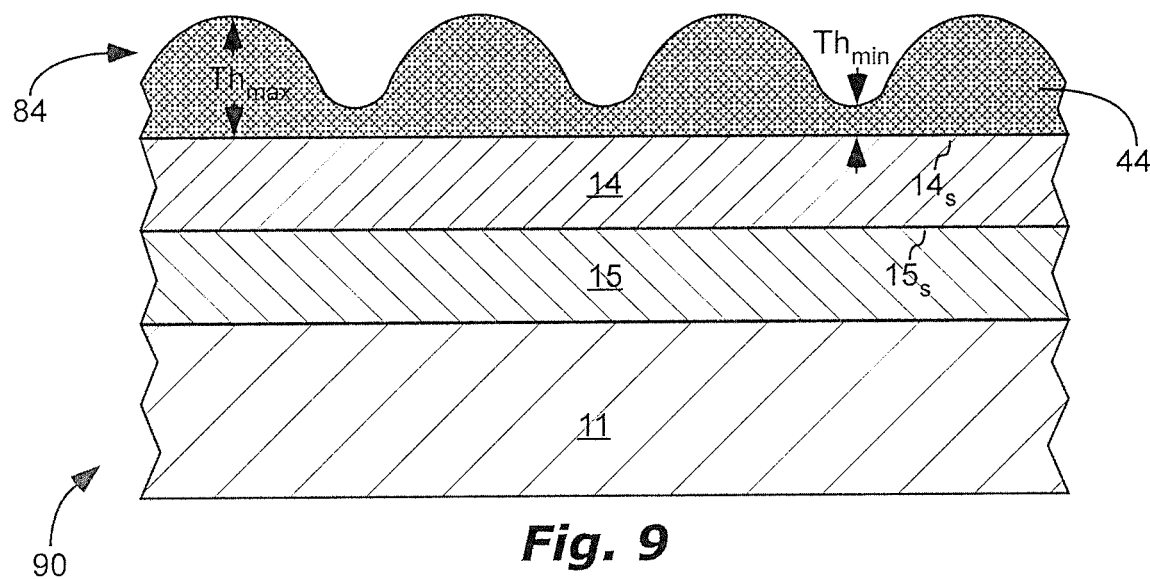

FIG. 9 is a step 90 in a method of making a polarizer, which can follow step 80, including a schematic, cross-sectional side-view of the uncured cover layer 34 formed into a cured cover layer 44, in accordance with an embodiment of the present invention.

Figure 10A:
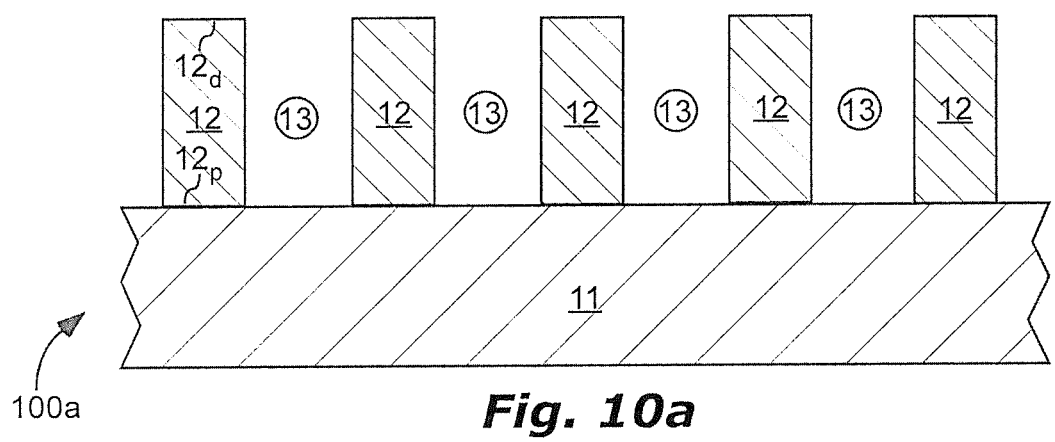

FIG. 10a is a step 100a in a method of making a polarizer, including a schematic, cross-sectional side-view of polarization structures 12 on a substrate 11, in accordance with an embodiment of the present invention.

Figure 10B:
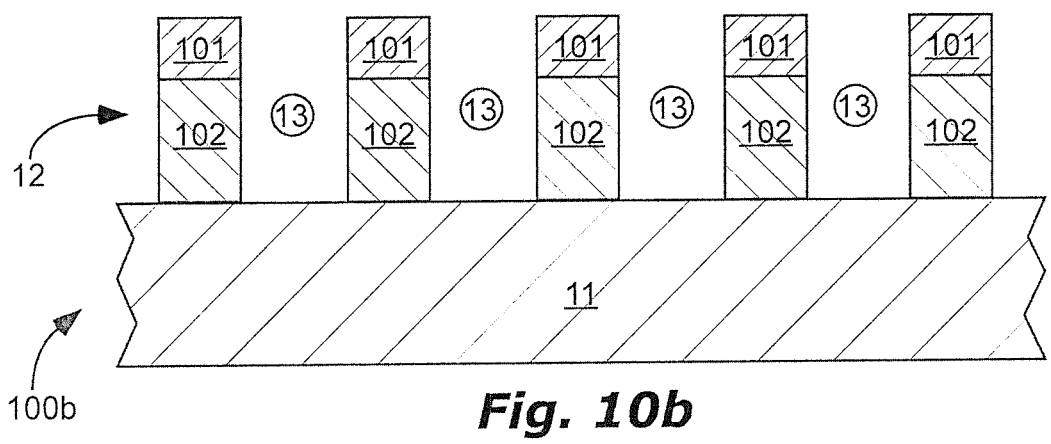

FIG. 10b is a schematic perspective-view of a polarizer 100b including a schematic, cross-sectional side-view of polarization structures 12 on a substrate 11, showing that the polarization structures 12 can comprise an array of wires, each wire including a reflective wire 102 and an absorptive rib 101, in accordance with an embodiment of the present invention.

Figure 11A:
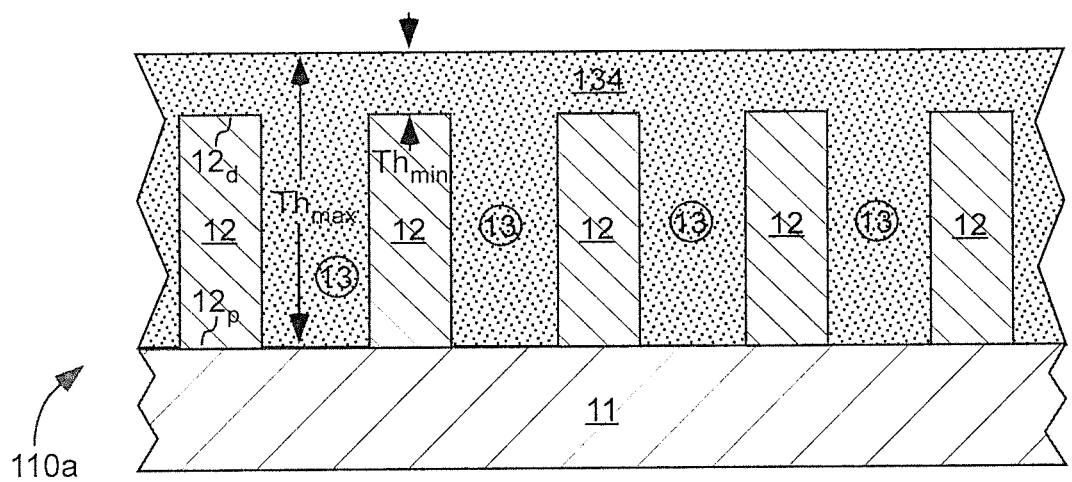

FIG. 11a is a step 110 in a method of making a polarizer, which can follow step 100a, including a schematic, cross-sectional side-view of an uncured fill layer 134 on top of polarization structures 12 and extending into channels 13 between the polarization structures 12, in accordance with an embodiment of the present invention.

Figure 11B:
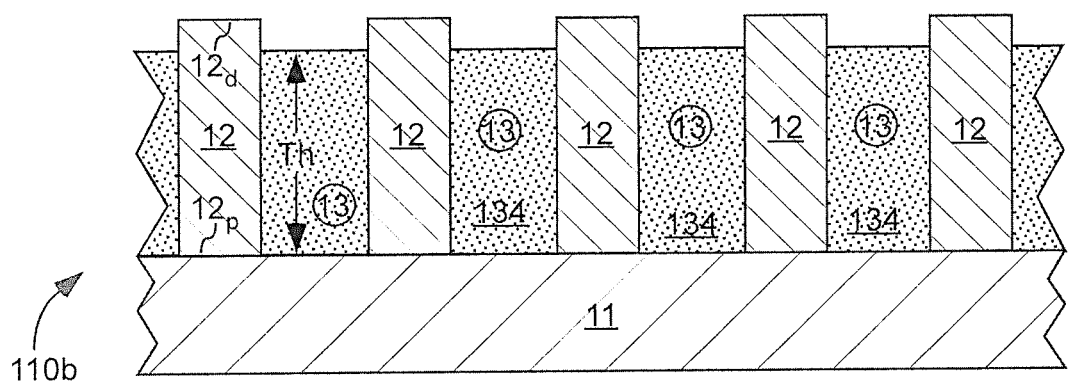

FIG. 11b is a step 110 in a method of making a polarizer, which can follow step 100a, including a schematic, cross-sectional side-view of an uncured fill layer 134 in channels 13 between the polarization structures 12, but not on top of the polarization structures 12, in accordance with an embodiment of the present invention.

Figure 12A:
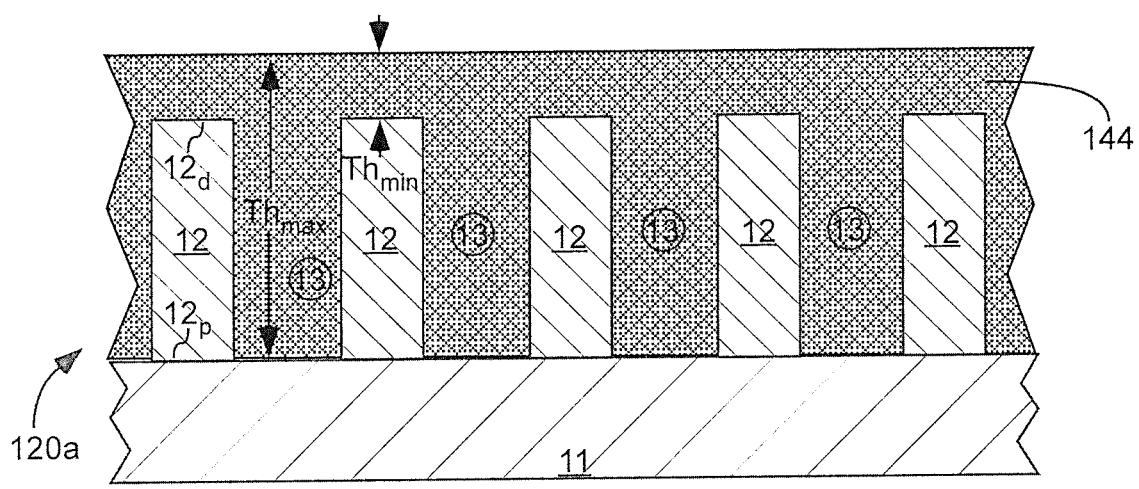

FIG. 12a is a step 120a in a method of making a polarizer, which can follow step 110a, including a schematic, cross-sectional side-view of the uncured fill layer 134 formed into a cured fill layer 144, in accordance with an embodiment of the present invention.

Figure 12B:
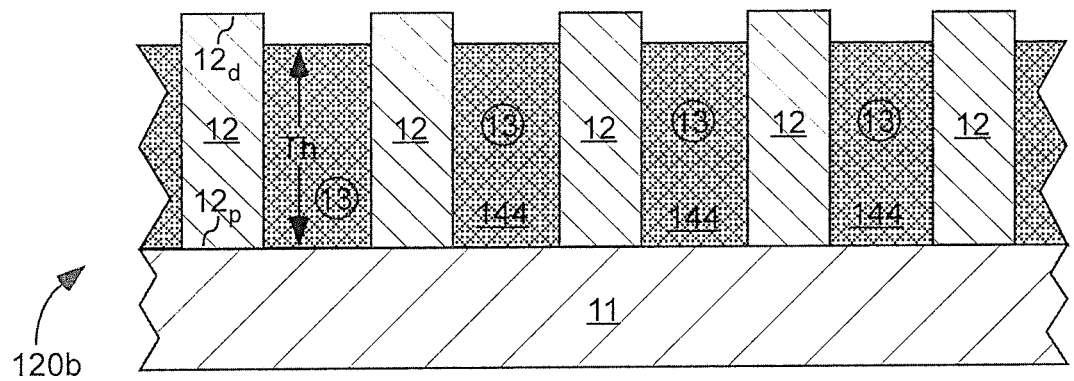

FIG. 12b is a step 120b in a method of making a polarizer, which can follow step 110b, including a schematic, cross-sectional side-view of the uncured fill layer 134 formed into a cured fill layer 144, in accordance with an embodiment of the present invention.

Figure 13:
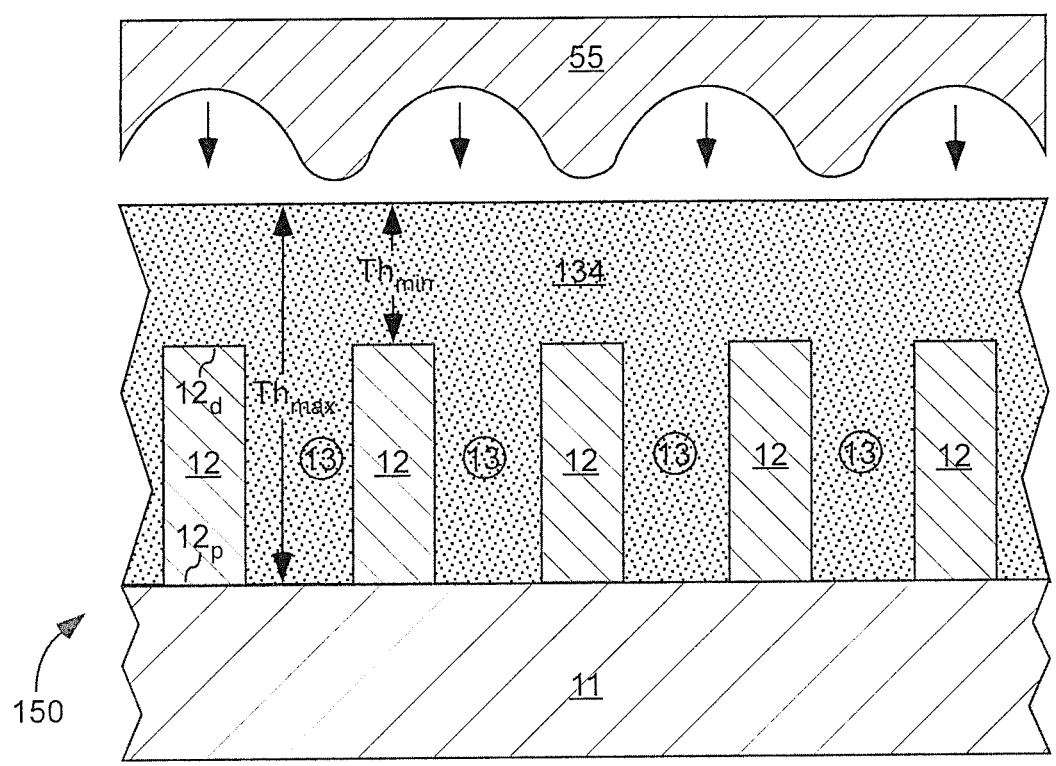
Figure 14:
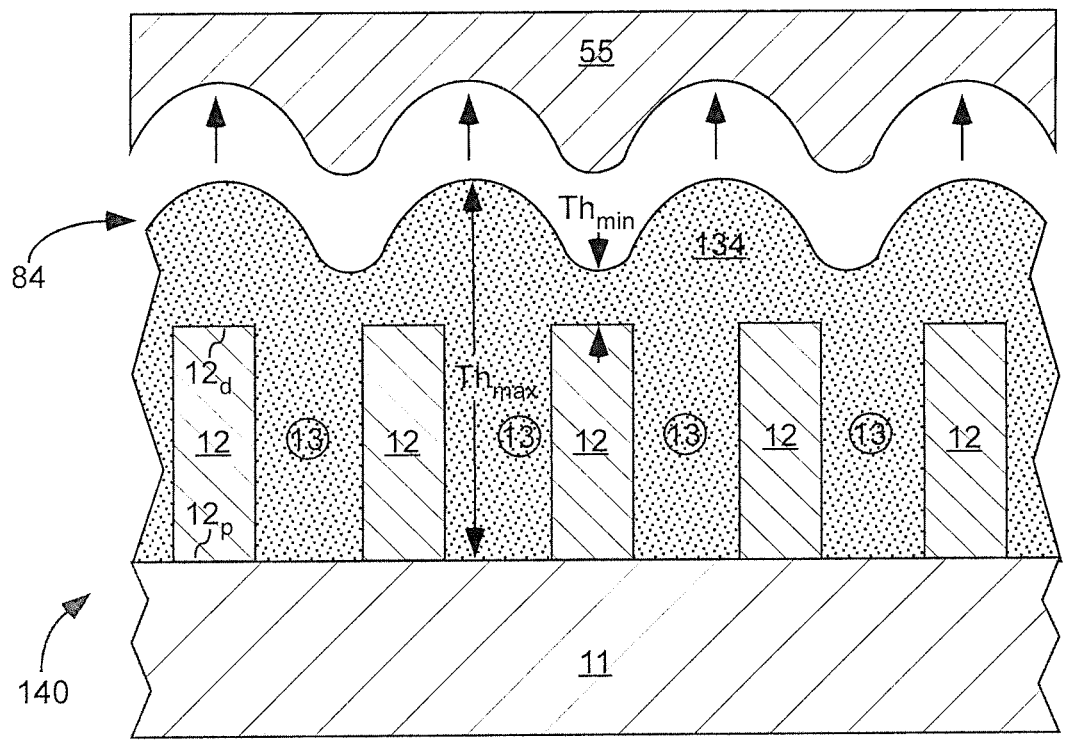

FIGS. 13-14 are steps 130 and 140 in a method of making a polarizer, which can follow step 110a, including schematic, cross-sectional side-views of imprinting a pattern of structures 84 in the uncured fill layer 134, in accordance with an embodiment of the present invention.

Figure 15:
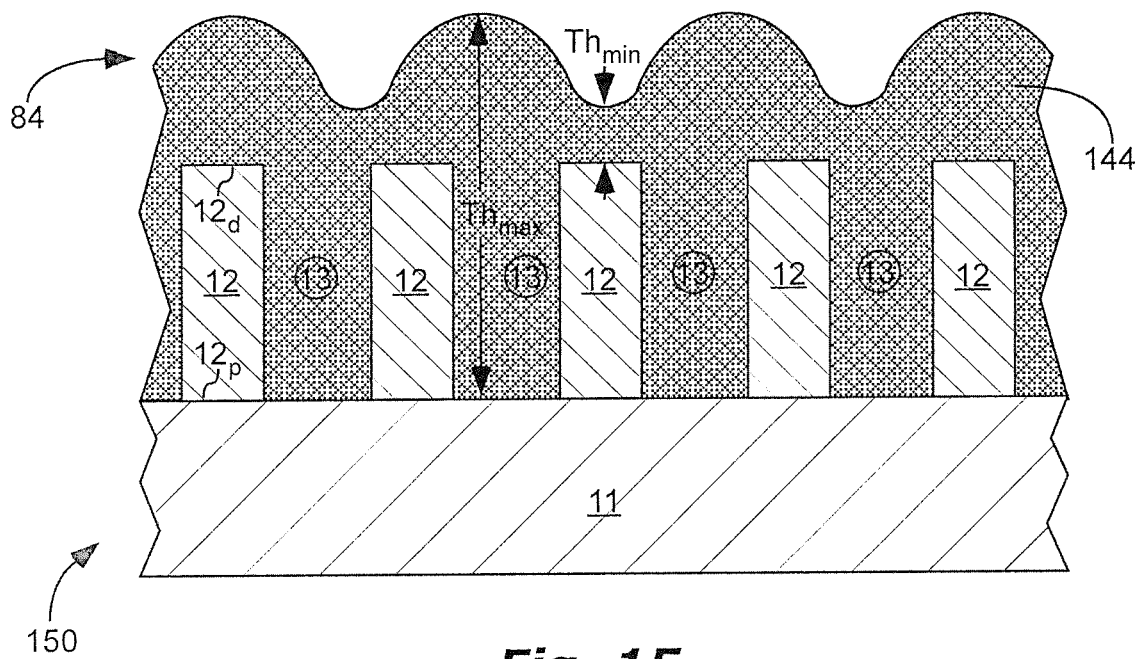

FIG. 15 is a step 150 in a method of making a polarizer, which can follow step 140, including a schematic, cross-sectional side-view of the uncured fill layer 134 formed into a cured fill layer 144, in accordance with an embodiment of the present invention.

Figure 16:
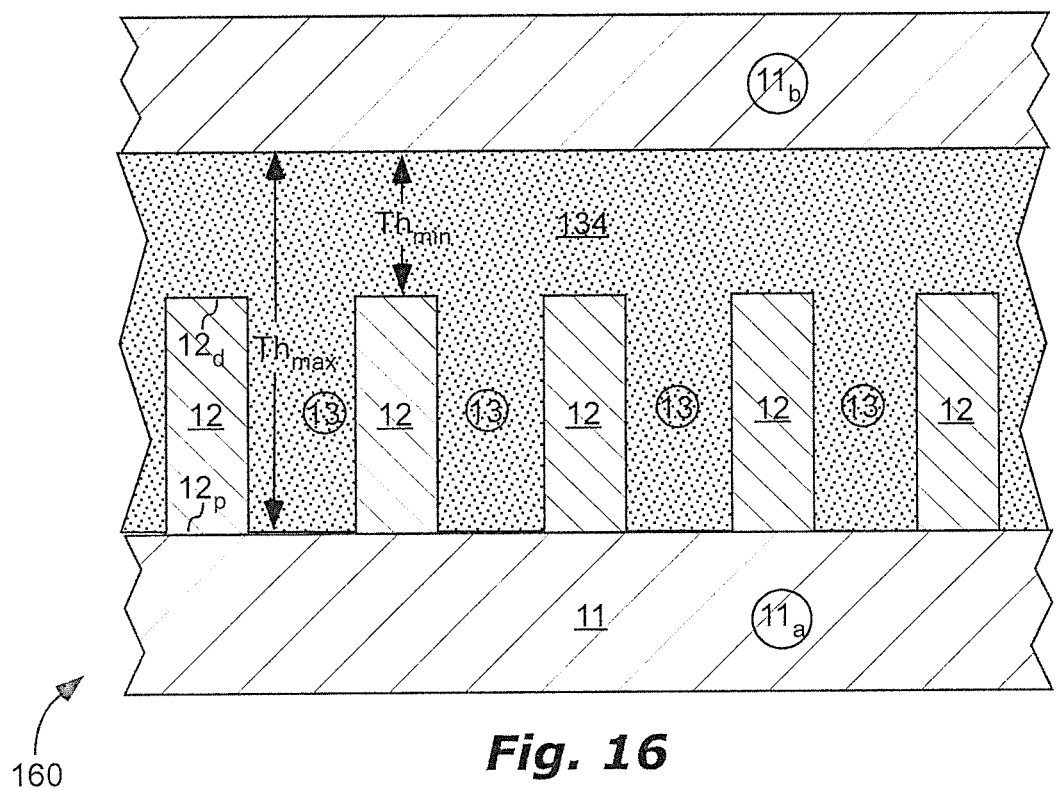

FIG. 16 is a step 160 in a method of making a polarizer, which can follow step 110a, including a schematic, cross-sectional side-view of a second substrate 11b on the uncured fill layer 134, in accordance with an embodiment of the present invention.

Figure 17:
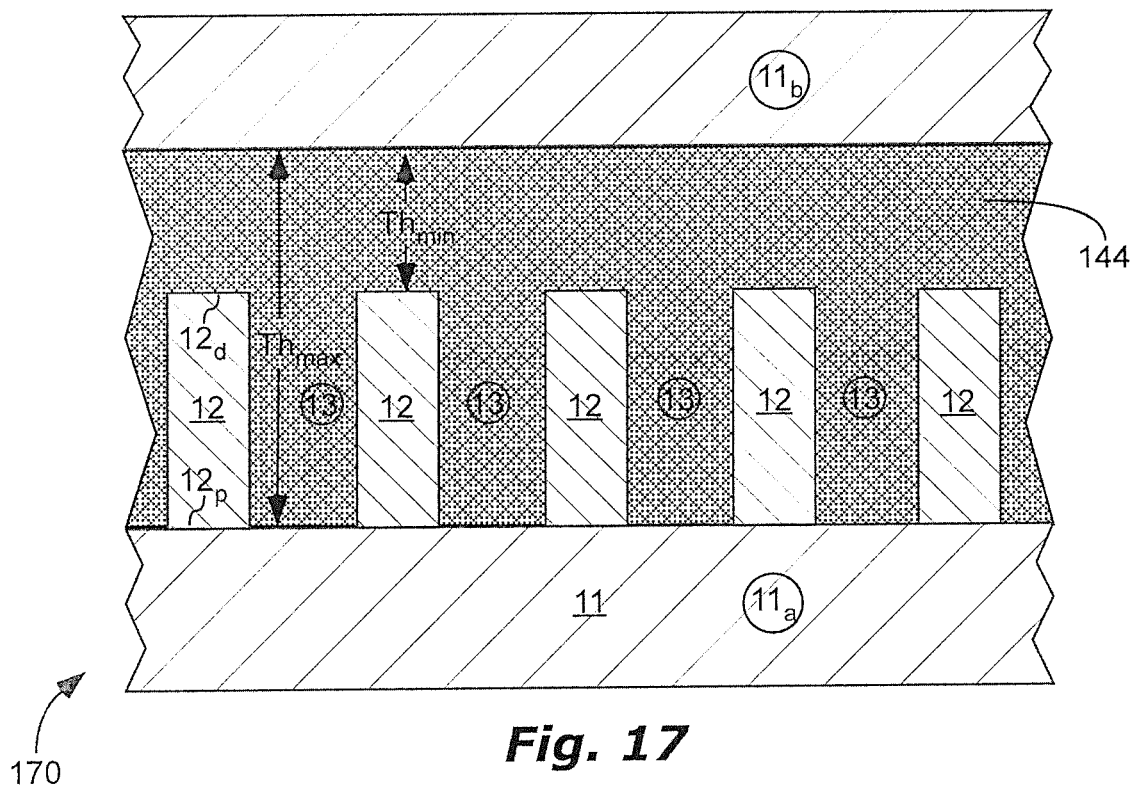

FIG. 17 is a step 170 in a method of making a polarizer, which can follow step 160, including a schematic, cross-sectional side-view of the uncured fill layer 134 formed into a cured fill layer 144, in accordance with an embodiment of the present invention.

Figure 18:
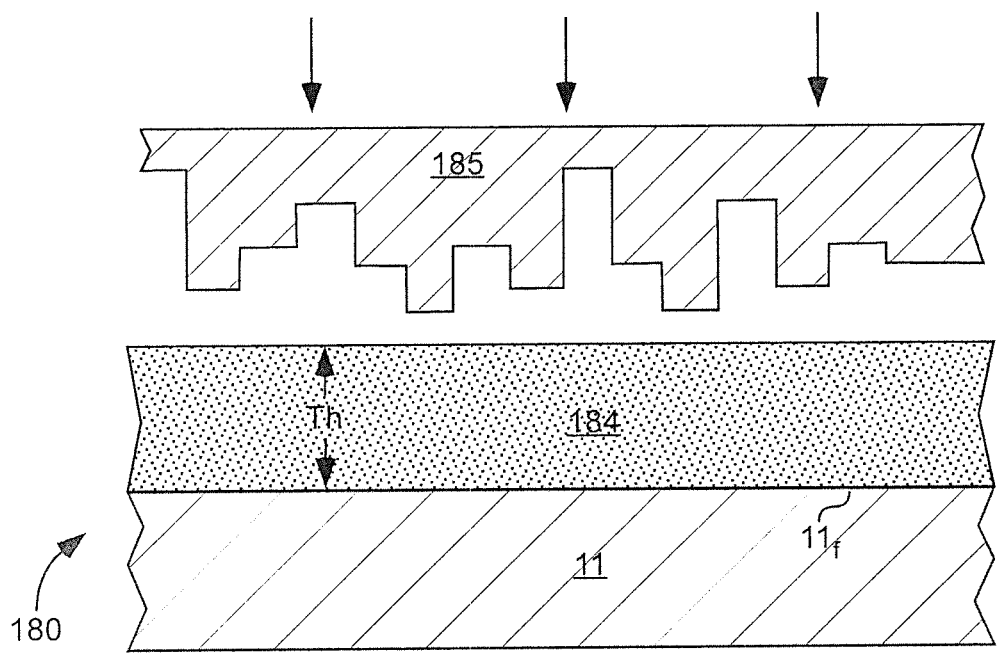
Figure 19:
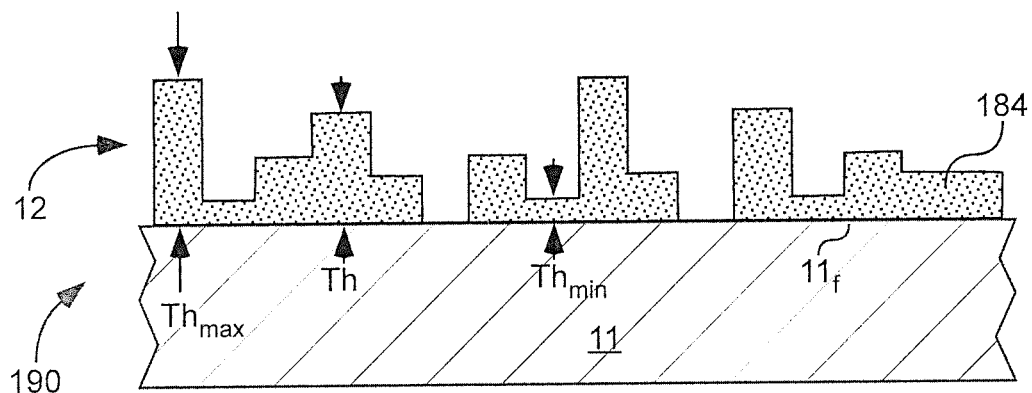

FIGS. 18-19 are steps 180 and 190 in a method of making a polarizer, including a schematic, cross-sectional side-view of an uncured imprintable layer 184 on a substrate 11 and imprinting a pattern of polarization structures 12 in the uncured imprintable layer 184, in accordance with an embodiment of the present invention.

Figure 20:
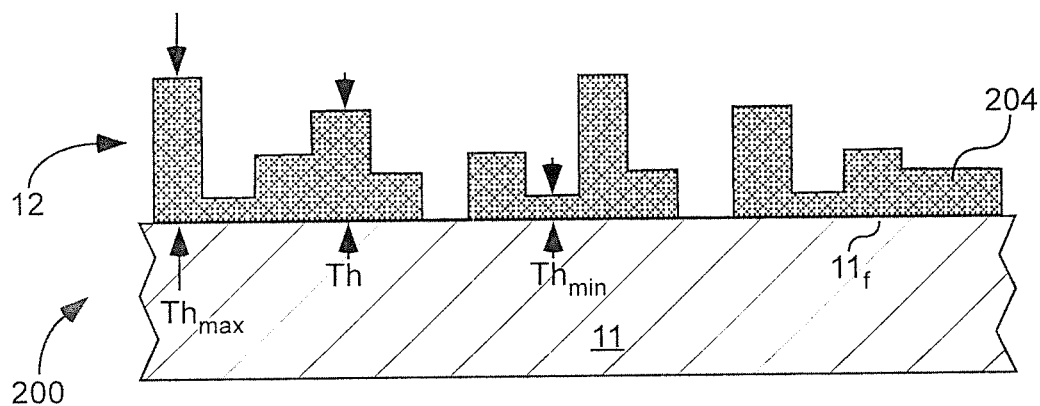

FIG. 20 is a step 200 in a method of making a polarizer, which can follow step 190, including a schematic, cross-sectional side-view of the uncured imprintable layer 184 formed into a cured printed layer 204, in accordance with an embodiment of the present invention.

Figure 21:
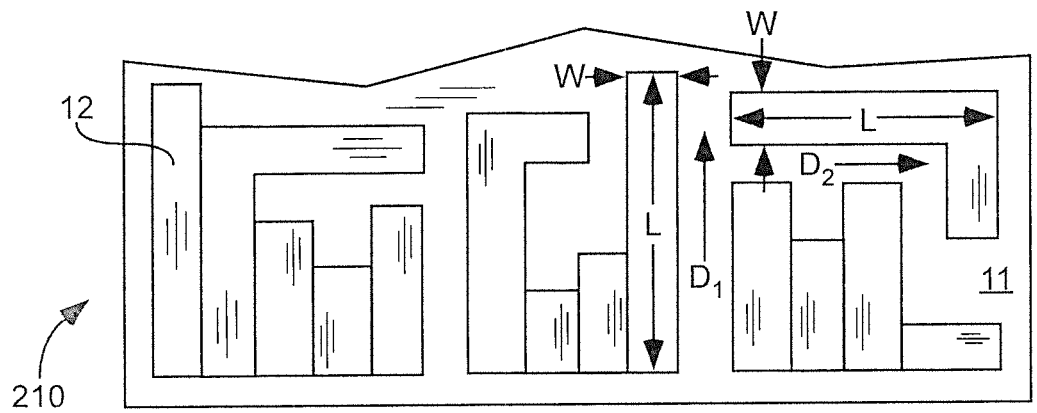

FIG. 21 is a schematic top-view of the polarizer of FIG. 19 or FIG. 20, in accordance with an embodiment of the present invention.

Figure 22:
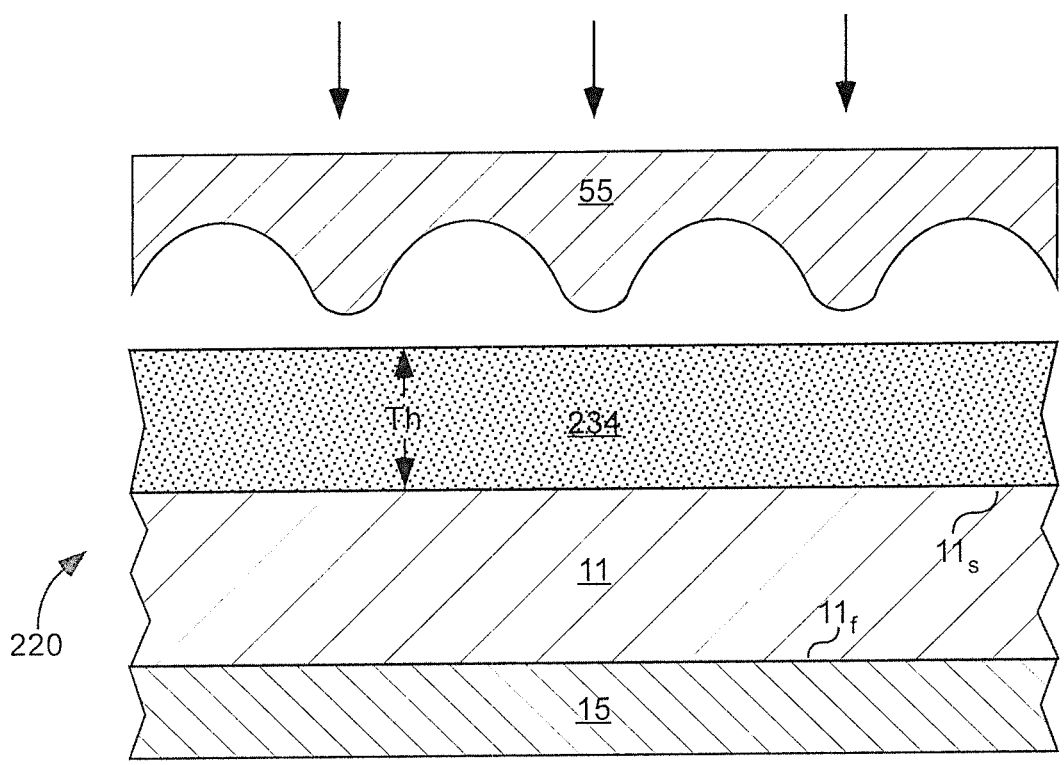
Figure 23:
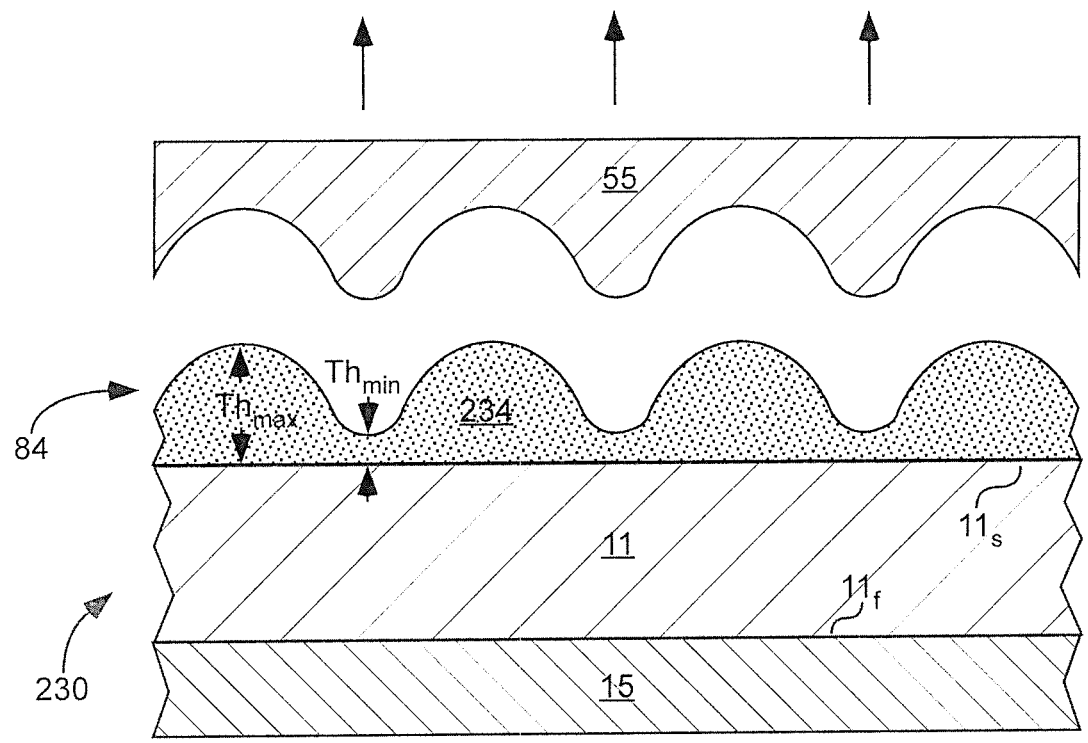

FIGS. 22 and 23 are steps 220 and 230 in a method of making a polarizer, and show a schematic, cross-sectional side-view of a polarization device 15 located on a first side $11_f$ of a substrate 11 and an uncured backside layer 234 on an opposite, second side $11_s$, of the substrate 11, and imprinting a pattern of structures 84 in the uncured backside layer 234, in accordance with an embodiment of the present invention.

Figure 24:
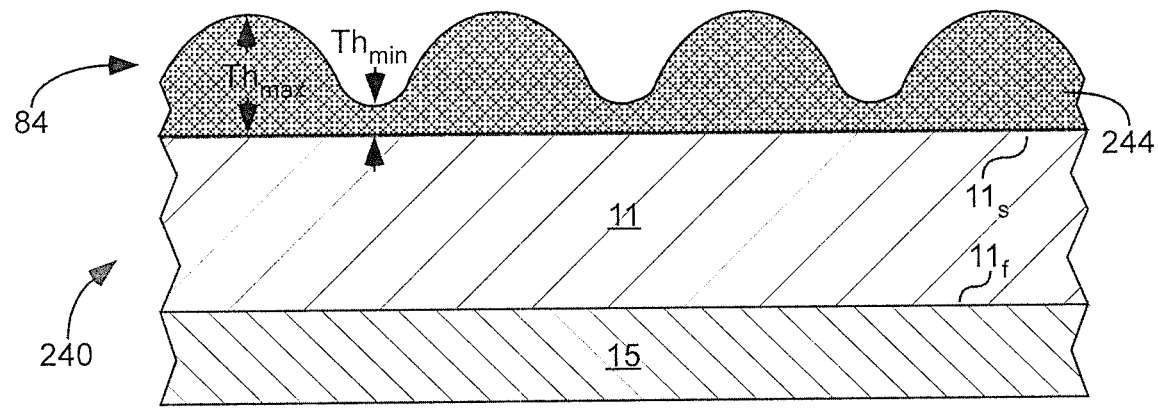

FIG. 24 is a step 240 in a method of making a polarizer, which can follow step 230, including a schematic, cross-sectional side-view showing the uncured backside layer 234 formed into a cured backside layer 244, in accordance with an embodiment of the present invention.

Figure 25:
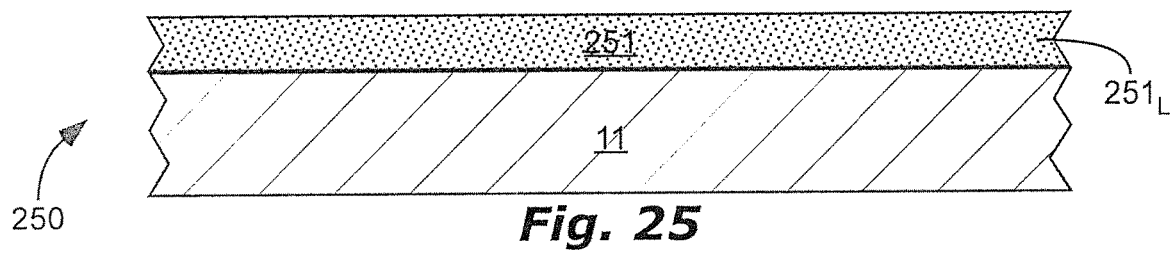

FIG. 25 is a step 250 in a method of making a polarizer, including a schematic, cross-sectional side-view showing applying an uncured lower thin film $251_L$ on a substrate 11, in accordance with an embodiment of the present invention.

Figure 26:
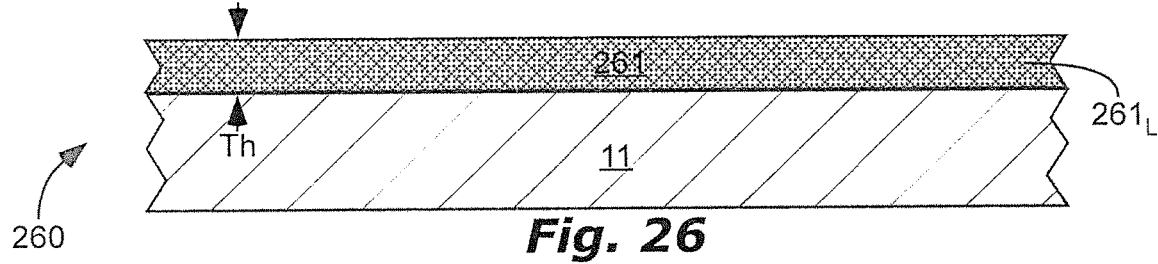

FIG. 26 is a step 260 in a method of making a polarizer, which can follow step 250, including a schematic, cross-sectional side-view showing curing the uncured lower thin film $251_L$ into a cured lower thin film 261, in accordance with an embodiment of the present invention.

Figure 27:
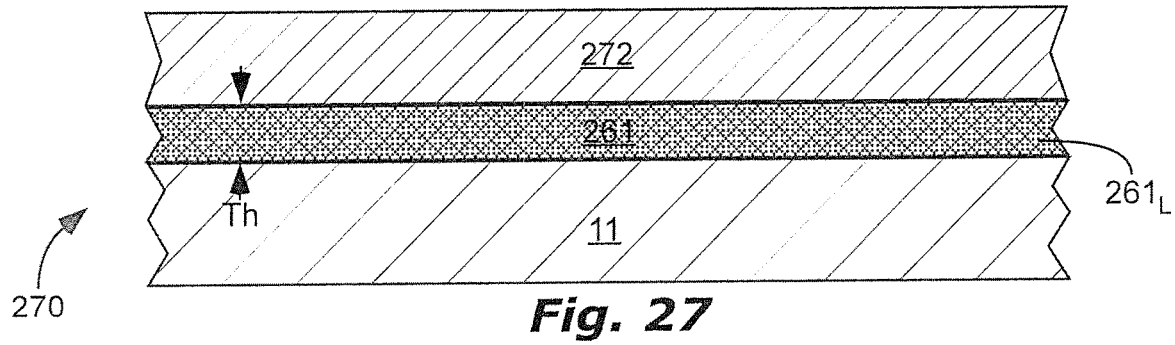

FIG. 27 is a step 270 in a method of making a polarizer, which can follow step 260, including a schematic, cross-sectional side-view showing applying a reflective thin film 272 on the cured lower thin film 261, in accordance with an embodiment of the present invention.

Figure 28A:
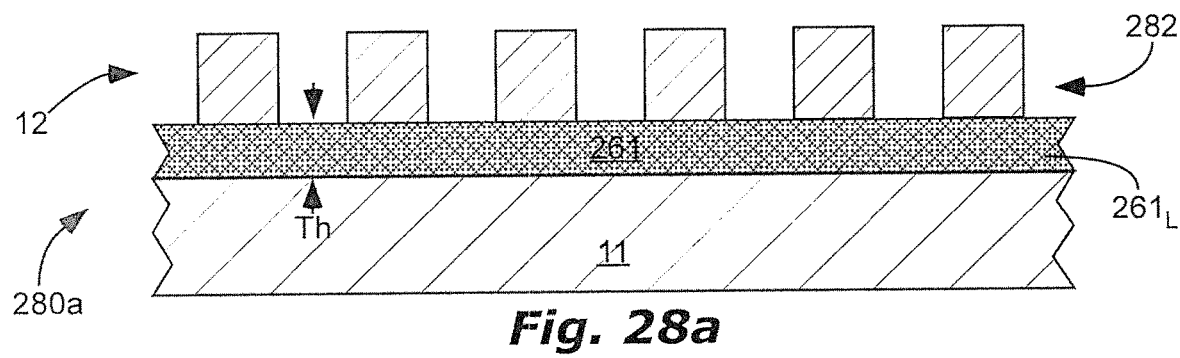

FIG. 28a is a step 280a in a method of making a polarizer, which can follow step 270, including a schematic, cross-sectional side-view showing etching the reflective thin film 272 to form polarization structures 12, in accordance with an embodiment of the present invention.

Figure 28B:
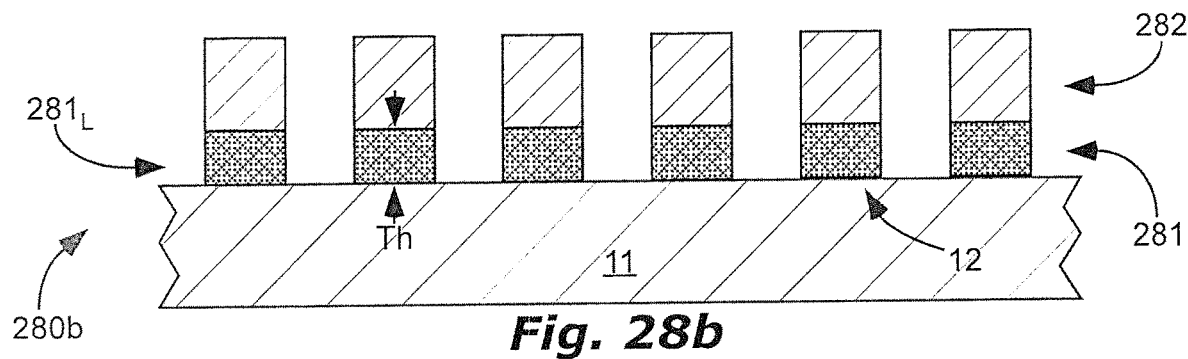

FIG. 28b is a step 280b in a method of making a polarizer, which can follow step 270, including a schematic, cross-sectional side-view showing etching the reflective thin film 272 and the cured lower thin film $261_L$ to form polarization structures 12, in accordance with an embodiment of the present invention.

Figure 29:
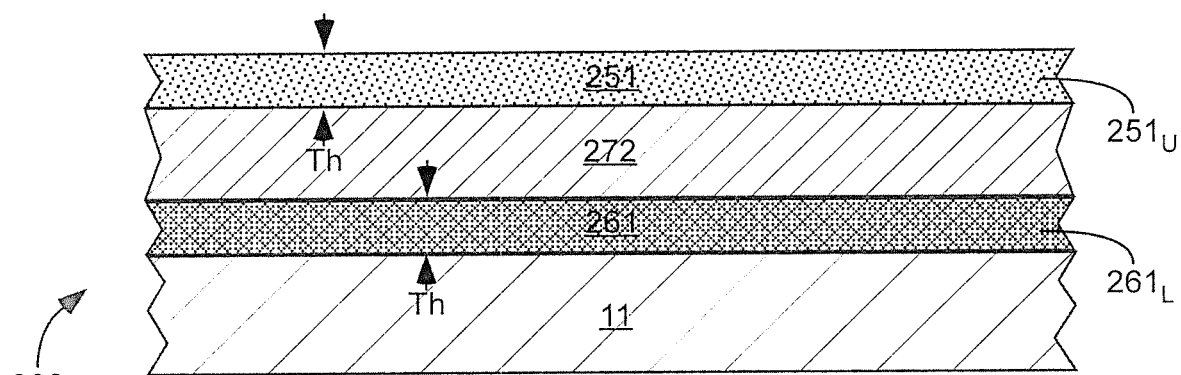

FIG. 29 is a step 290 in a method of making a polarizer, which can follow step 270, including a schematic, cross-sectional side-view showing applying an uncured upper thin film $251_U$ on the reflective thin film 272, in accordance with an embodiment of the present invention.

Figure 30:
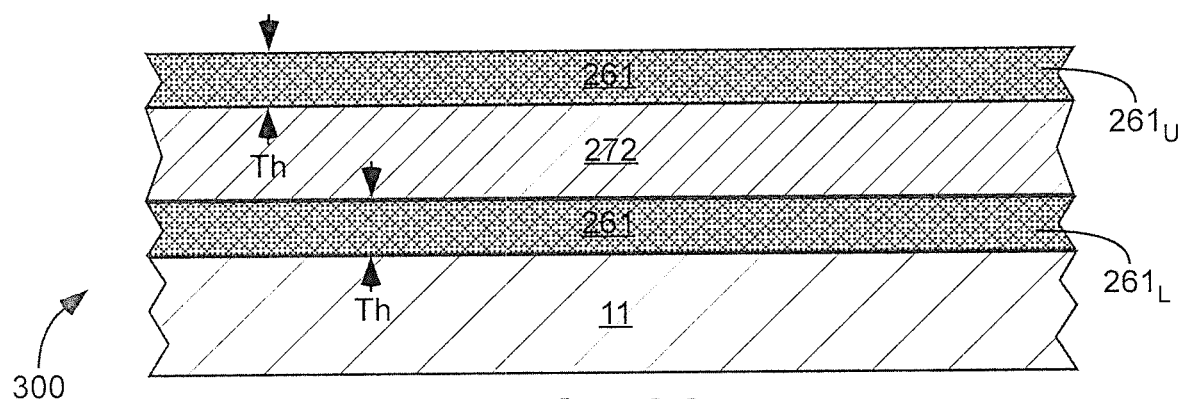

FIG. 30 is a step 300 in a method of making a polarizer, which can follow step 290, including a schematic, cross-sectional side-view showing curing the uncured upper thin film $251_U$ into a cured upper thin film $261_U$, in accordance with an embodiment of the present invention.

Figure 31:
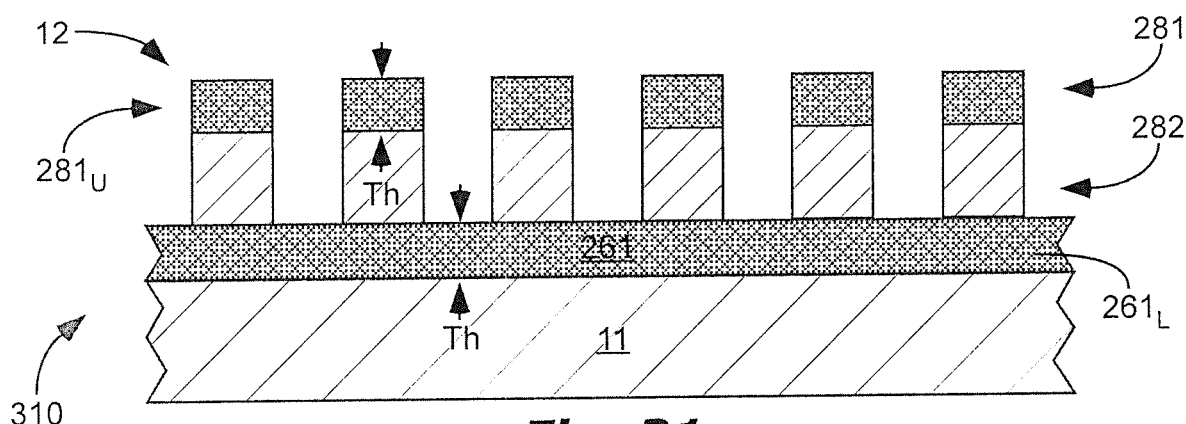

FIG. 31 is a step 310 in a method of making a polarizer, which can follow step 300, including a schematic, cross-sectional side-view showing etching the cured upper thin film $261_U$ and the reflective thin film 272 and to form polarization structures 12, in accordance with an embodiment of the present invention.

Figure 32:
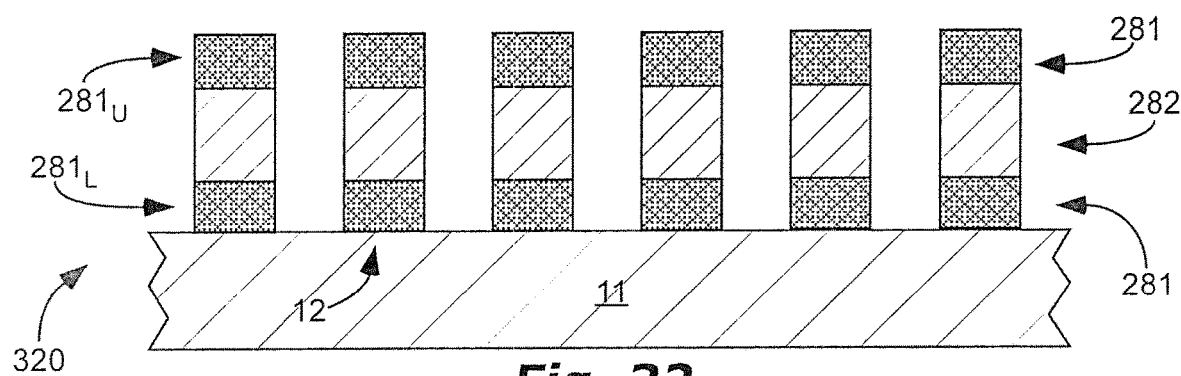

FIG. 32 is a step 320 in a method of making a polarizer, which can follow step 300, including a schematic, cross-sectional side-view showing etching the cured upper thin film $261_U$, the reflective thin film 272, and the cured lower thin film $261_L$ and to form polarization structures 12, in accordance with an embodiment of the present invention.

Figure 33:
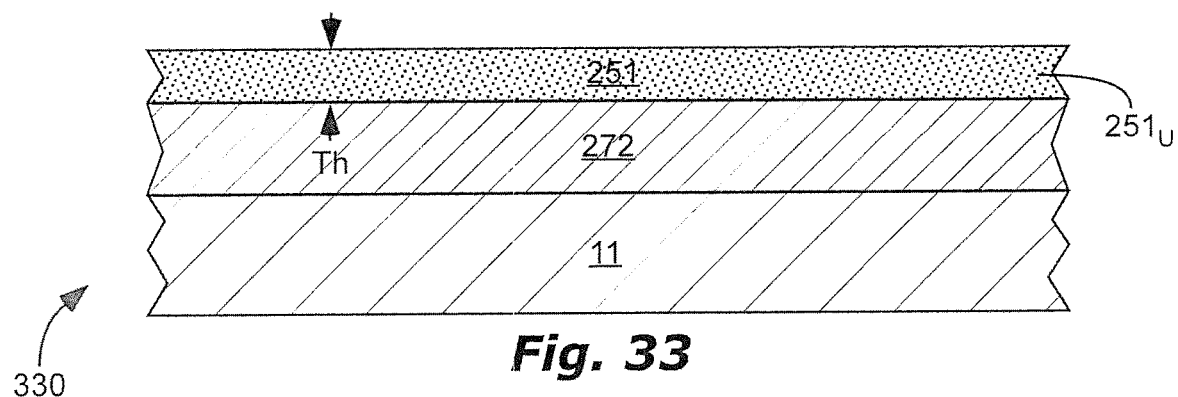

FIG. 33 is a step 330 in a method of making a polarizer, including a schematic, cross-sectional side-view showing applying a reflective thin film 272 on the substrate 11 and applying an uncured lower thin film $251_L$ on the reflective thin film 272, in accordance with an embodiment of the present invention.

Figure 34:
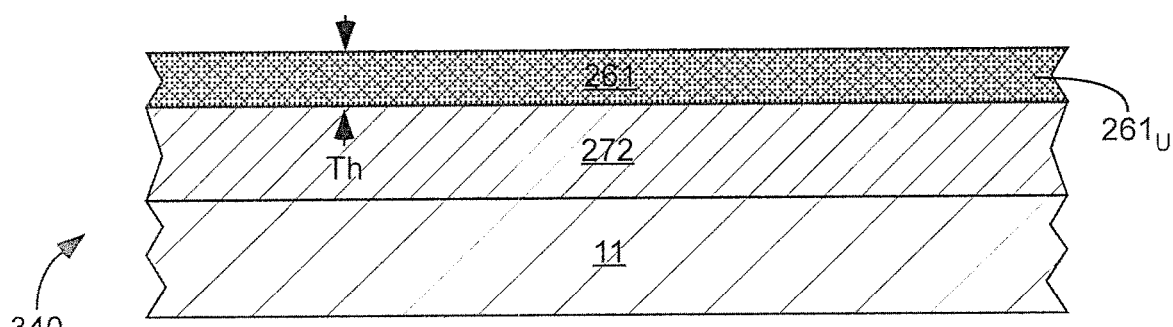

FIG. 34 is a step 340 in a method of making a polarizer, which can follow step 330, including a schematic, cross-sectional side-view showing curing the uncured upper thin film $251_U$ into a cured upper thin film $261_U$, in accordance with an embodiment of the present invention.

Figure 35:
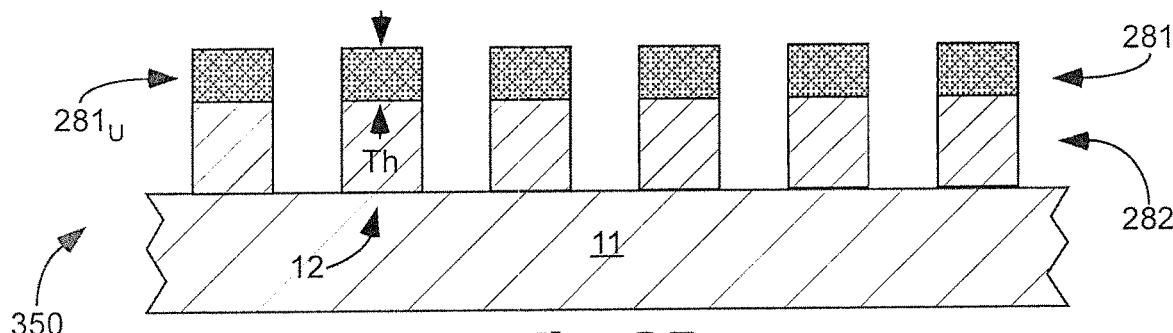

FIG. 35 is a step 350 in a method of making a polarizer, which can follow step 340, including a schematic, cross-sectional side-view showing etching the cured upper thin film $261_U$ and the reflective thin film 272 and to form polarization structures 12, in accordance with an embodiment of the present invention.

Figure 36:
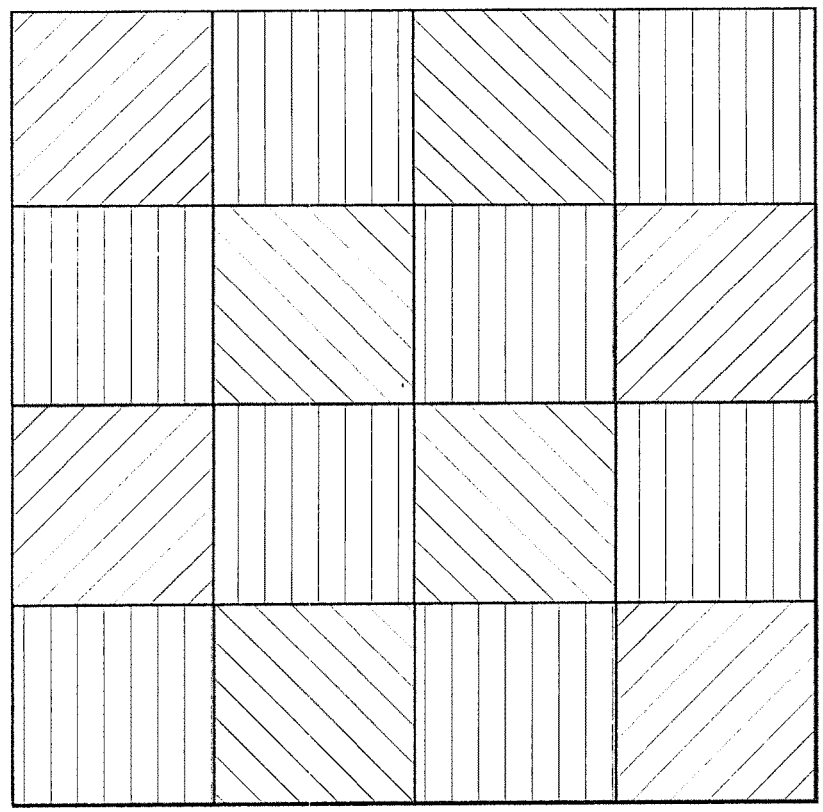

FIG. 36 is a step 360 in a method of making a polarizer, including imprinting separate pixels, in accordance with an embodiment of the present invention.

Figure 37:
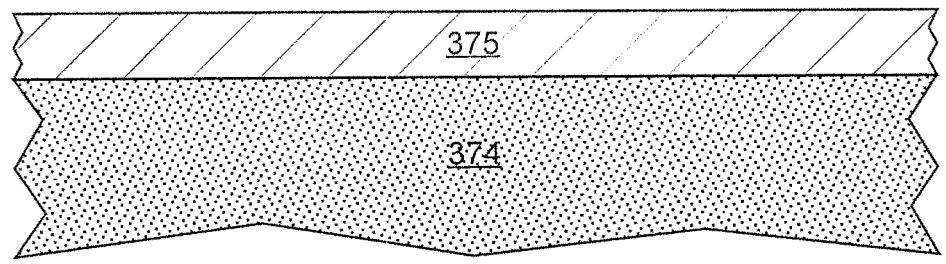

FIG. 37 is a step 370 in a method of making a polarizer, including sputter deposition of a thin film 375 onto the uncured layer 374, in accordance with an embodiment of the present invention.

Figure 38:
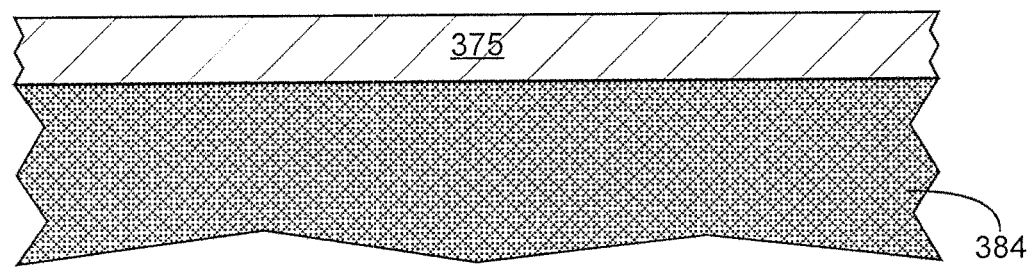

FIG. 38 is a step 380 in a method of making a polarizer, including sputter deposition of a thin film 375 onto the cured fill layer 384, in accordance with an embodiment of the present invention.

DEFINITIONS

As used herein, the term "contrast" means a fraction of transmission through the WGP of the predominantly transmitted polarization (e.g. Tp) divided by a fraction of transmission through the WGP of an opposite polarization (e.g. Ts). For example, contrast=Tp/Ts.

As used herein, the term "longitudinal dimension" means a longest dimension of the polarization structures 12 parallel to the first side $11_f$ of the substrate 11.

As used herein, the term "metal atoms" includes both true metals as well as metalloids, such as for example silicon and germanium.

As used herein, the term "nanometer-sized" means dimensions of ≤1000 nm.

As used herein, the term "nanoparticles" means particles with a width or diameter of ≤1000 nm. The nanoparticles can have a width or diameter of ≤500 nm, ≤100 nm, ≤50 nm, or ≤10 nm if explicitly so stated in the claims. The aforementioned width or diameter can be a largest width or diameter of all the nanoparticles if explicitly so stated in the claims. The nanoparticles can also have a width or diameter of ≥0.1 nm, ≥1 nm, or ≥5 nm if explicitly so stated in the claims. The aforementioned width or diameter can be a smallest width or diameter of all the nanoparticles if explicitly so stated in the claims.

As used herein, the term "nm" means nanometer(s) and the term "mm" means millimeter(s).

As used herein, the terms "on", "located on", "located at", and "located over" mean located directly on or located over with some other solid material between. The terms "located directly on", "adjoin", "adjoins", and "adjoining" mean direct and immediate contact with no other solid material between.

As used herein, the term "perpendicular" means exactly perpendicular or within 20 degrees of exactly perpendicular.

As used herein, the term "pixels" means different regions of an optical device with intentionally different optical properties.

As used herein, the term "parallel" means exactly parallel, parallel within normal manufacturing tolerances, or nearly parallel, such that any deviation from exactly parallel would have negligible effect for ordinary use of the device.

As used herein, the term "rpm" means revolutions per minute.

Materials used in optical structures can absorb some light, reflect some light, and transmit some light. The following definitions distinguish between materials that are primarily absorptive, primarily reflective, or primarily transparent. Each material can be considered to be absorptive, reflective, or transparent in a specific wavelength range (e.g. ultraviolet, visible, or infrared spectrum) and can have a different property in a different wavelength range. Thus, whether a material is absorptive, reflective, or transparent is dependent on the intended wavelength range of use. Materials are divided into absorptive, reflective, and transparent based on reflectance R, the real part of the refractive index n, and the imaginary part of the refractive index/extinction coefficient k. Equation 1 is used to determine the reflectance R of the interface between air and a uniform slab of the material at normal incidence:

$$R = \frac{(n-1)^2 + k^2}{(n+1)^2 + k^2} \qquad \text{Equation 1}$$

Unless explicitly specified otherwise herein, materials with k≤0.1 in the specified wavelength range are "transparent" materials, materials with k>0.1 and R≤0.6 in the specified wavelength range are "absorptive" materials, and materials with k>0.1 and R>0.6 in the specified wavelength range are "reflective" materials.

DETAILED DESCRIPTION

First Method—Cover Layer 34/44 on Overcoat Layer 14

As illustrated in FIGS. 1-9, a first method of making a polarizer can comprise some or all of the following steps, which can be performed in the following order. There may be additional steps not described below. These additional steps may be before, between, or after those described.

As illustrated in FIG. 1, one step 10 in the first method can include providing a polarization device 15 on a substrate 11. The substrate 11 can be transparent. The polarization device 15 can include objects or materials arranged in a pattern for polarization of light. For example, the polarization device 15 can be an array of parallel wires as the polarization structures 12 as shown in FIG. 2, polarization structures 12 extending in different directions such as is shown in FIGS. 19-21, or a film polarizer.

An overcoat layer 14 can be applied or located on a surface $15_s$ of the polarization device 15 farthest from the substrate 11. The overcoat layer 14 can be a single layer of a single material or can be multiple layers of different materials. The overcoat layer 14 can be sputtered onto the polarization device 15, applied by atomic layer deposition, or other method. The overcoat layer 14 can be applied as described in patent publication US 2010/0103517.

If the polarization device 15 includes an array of wires with channels 13 between adjacent wires, the overcoat layer 14 can extend into the channels 13 and can fill the channels 13. Alternatively, the channels 13 can be free of the overcoat layer 14. The channels 13 can be partially filled with the overcoat layer 14, such as for example ≥10% filled, ≥25% filled, or ≥40% filled, and can be ≤60% filled, ≤80% filled, or ≤90% filled.

A schematic perspective-view of a polarizer 20 is illustrated in FIG. 2, with elongated wires on a substrate 11, in accordance with an embodiment of the present invention. The polarization structures 12 of the various embodiments described herein can be similarly elongated. As used herein, the term "elongated" means that a length $L_{12}$ of the wires is substantially greater than wire width $W_{12}$ or wire thickness $Th_{12}$ (e.g. $L_{12}$ can be ≥10 times, ≥100 times, ≥1000 times, or ≥10,000 times larger than wire width $W_{12}$ and/or wire thickness $Th_{12}$). For example, $L_{12}$ can be ≥1 mm or ≥10 mm, $W_{12}$ can be ≤200 nm or ≤100 nm, and $Th_{12}$ can be ≤500 nm or ≤1000 nm.

As illustrated in FIG. 3, another step 30 in the first method can be applying an uncured cover layer 34 to an outer surface $14_s$ of the overcoat layer 14 farthest from the polarization device 15. Step 30 can follow step 10.

As illustrated in FIG. 5, the substrate 11 can be a first substrate $11_a$. The first method can further comprise step 50, placing a second substrate $11_b$ onto the uncured cover layer 34. Step 50 can follow step 30.

As illustrated in FIGS. 7-8, other steps 70 and 80 in the first method can include imprinting a pattern of structures 84 in the uncured cover layer 34. A stamp 55 can imprint the structures 84 in the uncured cover layer 34. The structures 84 can be sized and shaped to reduce reflection of incident light, to increase heat transfer away from the polarizer, or both. For example, the structures 84 can be shaped like ribs or pillars to increase surface area for heat transfer, to reduce reflection, or both. Steps 70 and 80 can follow step 30.

As illustrated in FIGS. 4, 6, and 9, steps 40, 60, and 90 respectively in the first method can include curing (i.e. causing a chemical reaction in) the uncured cover layer 34 to form a cured cover layer 44. Characteristics of the uncured cover layer 34, characteristics of the cured cover layer 44, and curing are described below in the Added Features Applicable to All Methods section. Step 40 can follow step 30, step 60 can follow step 50, and step 90 can follow step 80.

If the polarization device 15 includes channels 13 between adjacent polarization structures 12, it can be difficult to manufacture the overcoat layer 14 with sufficient integrity to keep the uncured cover layer 34, and thus also the cured cover layer 44, out of the channels 13. If the uncured cover layer 34 enters only some of the channels 13, tensile forces in the uncured cover layer 34, in the cured cover layer 44, or both can cause polarization structures 12 to topple, thus impairing polarization. Also, polarization will not be uniform across the polarizer if the cured cover layer 44 is in only some of the channels 13.

One way to keep the uncured cover layer 34 out of the channels 13 is to select chemistry of the uncured cover layer 34 that is repellant with respect to chemistry of all of, or at least the outer surface $14_s$ of, the overcoat layer 14. A material for the overcoat layer 14 or for the outer surface $14_s$ of the overcoat layer 14 can have a relatively low surface energy and a solvent of the uncured cover layer 34 can have a relatively high surface tension. The surface tension of the uncured cover layer 34 can be greater than the surface energy of the outer surface $14_s$ of the overcoat layer 14. For example, if the uncured cover layer 34 includes water as a solvent, then the outer surface $14_s$ of the overcoat layer 14 can include a hydrophobic coating. Another way to keep the uncured cover layer 34 out of the channels 13 is to use larger nanoparticles.

Proper selection of chemistry of the uncured cover layer 34 and of the outer surface $14_s$ and large nanoparticle size, can result in channels 13 between adjacent polarization structures 12 that are free of the uncured cover layer 34 and free of the cured cover layer 44, or that are nearly free of the uncured cover layer 34 and the cured cover layer 44. For example, ≥98%, ≥99%, or ≥99.9% of a total volume of the channels 13 can be free of the uncured cover layer 34 and the cured cover layer 44.

A polarizer made from the first method can have some or all of the following characteristics: high contrast (e.g. Tp/Ts), ability to endure a high temperature, resistant to physical damage, and relatively easy to manufacture.

Second Method—Fill Layer 134/144 in Channels 13

As illustrated in FIGS. 10a-17, a second method of making a polarizer can comprise some or all of the following steps, which can be performed in the following order. There may be additional steps not described below. These additional steps may be before, between, or after those described.

As illustrated in FIG. 10a, one step 10 in the second method can be providing a polarizer. The polarizer can include polarization structures 12 on a substrate 11. The substrate 11 can be transparent. The polarization structures 12 can be arranged in a pattern for polarization of light. For example, the polarization structures 12 can be an array of parallel, elongated wires with channels 13 between adjacent wires. Alternately, the polarization structures 12 can extend in different directions as described below and shown in FIGS. 19-21. The polarization structures 12 can have a proximal end $12_p$ closer to the substrate 11 and a distal end $12_d$ farther from the substrate 11. The polarization structures 12 can include materials for polarization of light.

As illustrated in FIG. 10b, polarizer 100b is shown with the polarization structures 12 comprising an array of wires, each wire including a reflective wire 102 and an absorptive rib 101. On polarizer 100b, the reflective wire 102 is sandwiched between the absorptive rib 101 and the substrate 11. An opposite order, with the absorptive rib 101 sandwiched between the reflective wire 102 and the substrate 11, is within the scope of the inventions herein. The polarization structures 12 of any of the methods described herein can include a reflective wire 102 and an absorptive rib 101, however, this embodiment might be particularly suited to the second method if the cured cover layer 44 is used as a heat sink or for heat transfer of heat away from the polarization structures 12.

As illustrated in FIG. 11a, another step 110a in the second method can be applying an uncured fill layer 134 on top of the polarization structures 12 and extending into channels 13 between the polarization structures 12. Step 110a can follow step 100a. Step 110a can use polarizer 100b.

As illustrated in FIG. 11b, another step 110b in the second method can be applying an uncured fill layer 134 in channels 13 between the polarization structures 12 but not on top of the polarization structures 12. Step 110b can follow step 100a. Step 110b can use polarizer 100b.

As illustrated in FIGS. 14-15, other steps 140 and 150 in the second method can include imprinting a pattern of structures 84 in the uncured fill layer 134. A stamp 55 can be used to imprint the structures 84. The structures 84 can be sized and shaped to reduce reflection of incident light, to increase heat transfer away from the polarizer, or both. For example, the structures 84 can be shaped like ribs or pillars to increase surface area for heat transfer, to reduce reflection, or both. Steps 140 and 150 can follow step 110.

As illustrated in FIG. 16, the substrate 11 can be a first substrate $11_a$. The second method can further comprise step 160, placing a second substrate $11_b$ onto the uncured fill layer 134. Step 160 can follow step 110.

As illustrated in FIGS. 12a, 12b, 15, and 17, steps 120a, 120b, 150, and 170 respectively in the second method can include curing (i.e. causing a chemical reaction in) the uncured fill layer 134 to form a cured fill layer 144. Characteristics of the uncured fill layer 134, characteristics of the cured fill layer 144, and curing are described below in the Added Features Applicable to All Methods section. Step 120a can follow step 110a, step 120b can follow step 110b, step 150 can follow step 140, and step 170 can follow step 160.

In the second method, complete, or nearly complete, filling the channels 13 with the cured fill layer 144 can be a consideration for optical properties of the polarizer and can be a consideration for structural support of the polarization structures 12. For example, the cured fill layer 144 can fill ≥75%, ≥90%, ≥95%, or ≥98% of the channels 13.

Filling the channels with the uncured fill layer 134 facilitates filling the channels with the cured fill layer 144. One way to help fill the channels 13 is to select chemistry of the uncured fill layer 134 that is attractive with respect to chemistry of an outer surface of the polarization structures 12. For example, the uncured fill layer 134 can be primarily an aqueous solution and the outer surface of the polarization structures 12 can be hydrophilic, such as an oxide. A material for the outer surface of the polarization structures 12 can have a relatively high surface energy and a solvent of the uncured fill layer 134 can have a relatively low surface tension. The surface energy of the outer surface of the polarization structures 12 can be greater than the surface tension of the uncured fill layer 134. For example, the surface energy of the surface of the polarization structures 12 can be two times greater than, five times greater than, or ten times greater than the surface tension of the uncured fill layer 134. For example, if the uncured fill layer 134 includes water as a solvent, then the outer surface of the polarization structures 12 can include a hydrophilic coating. Another way to help fill the channels 13 with the uncured fill layer 134 is to use smaller nanoparticles.

A polarizer made from the second method can have some or all of the following characteristics: high contrast (e.g. Tp/Ts), ability to endure a high temperature, resistant to physical damage, and be relatively easy to manufacture. This embodiment can be particularly helpful for high temperature endurance due to the cured fill layer 144 in the channels 13—the cured fill layer 144 can be an effective heat sink or heat transfer path to draw heat away from the polarization structures 12.

Third Method—Imprintable Layer 184 and Printed Layer 204

As illustrated in FIGS. 18-21, a third method of making a polarizer can comprise some or all of the following steps, which can be performed in the following order. There may be additional steps not described below. These additional steps may be before, between, or after those described.

As illustrated in FIG. 18, one step 180 in the third method can include providing a substrate 11 that is transparent. An uncured imprintable layer 184 can be applied to a first side $11_f$ of the substrate 11. As illustrated in FIGS. 18-19, steps 180 and 190 in the third method can include imprinting a pattern of polarization structures 12 in the uncured imprintable layer 184.

As illustrated in FIG. 20, another step 200 in the method can include curing (i.e. causing a chemical reaction in) the uncured imprintable layer 184 to form a cured printed layer 204. Characteristics of the uncured imprintable layer 184, characteristics of the cured printed layer 204, and curing are described below in the Added Features Applicable to All Methods section. Step 200 can follow step 190.

Characteristics of the polarization structures 12 are shown in FIGS. 19-21 and can include the following: A longitudinal dimension L of some of the polarization structures 12 can extend in a first direction $D_1$. A longitudinal dimension L of other of the polarization structures 12 can extend in a second direction $D_2$. The first direction $D_1$ and the second direction $D_2$ can be parallel to the first side $11_f$ of the substrate 11. The first direction $D_1$ can be a different direction from the second direction $D_2$. The first direction $D_1$ can be perpendicular to the second direction $D_2$. A longitudinal dimension L of some of the polarization structures 12 can extend in at least three different directions or at least four different directions.

The polarization structures 12 can have a width W that is perpendicular to the longitudinal dimension L and parallel to the first side $11_f$ of the substrate 11. The width W of at least some of the polarization structures 12 extending in the first direction $D_1$ and a width W of at least some of the polarization structures 12 extending in the second direction $D_2$ can be ≤100 nm, ≤500 nm, or ≤1000 nm.

The polarization structures 12 can have multiple, different thicknesses Th. The thickness Th is a dimension perpendicular to the first side $11_f$ of the substrate 11. For example, the polarization structures can have ≥two, ≥three, ≥four, or ≥five different thicknesses Th. Each of these different thicknesses Th can differ from each other, such as for example by ≥5 nm, ≥10 nm, ≥20 nm, or ≥40 nm and/or by ≤60 nm, ≤120 nm, or ≤500 nm.

The substrate 11 and the polarization structures 12 can be made of the same material. For example, the substrate 11 and the polarization structures 12 can both be dielectric. A material composition of the substrate 11 and of the polarization structures 12 can be or can include glass.

One distinct characteristic of the polarizer of the third method is the ability to transmit ≥50% of incident unpolarized light as a single polarization. For example, this polarizer can transmit ≥50%, ≥60%, ≥70%, or ≥80%, of incident light as a single polarization.

Examples of an extinction ratio of the polarizer of the third method can be ≥2, ≥3, ≥5, or ≥10. The extinction ratio means an amount of incident light transmitted as a predominantly-transmitted polarization divided by an amount of the incident light transmitted as an opposite polarization.

A polarizer made from the third method can have a high percent transmission of one polarization and can be relatively easy to manufacture.

Fourth Method—Backside Layer 234/244

As illustrated in FIGS. 22-24, a fourth method of making a polarizer can comprise some or all of the following steps, which can be performed in the following order. There may be additional steps not described below. These additional steps may be before, between, or after those described.

As illustrated in FIG. 22, one step 220 in the fourth method can include providing a polarizer with a substrate 11 having a first side $11_f$ and a second side $11_s$ opposite of the first side $11_f$. The substrate 11 can be transparent. A polarization device 15 can be located on the first side $11_f$ of the substrate 11. The polarization device 15 can include objects or materials arranged in a pattern for polarization of light. The polarization device 15 can be any described herein or other type of polarizer.

As illustrated in FIGS. 22-23, steps 220 and 230 in the fourth method can include applying an uncured backside layer 234 to the second side $11_s$ of the substrate 11 and imprinting a pattern of structures 84 in the uncured backside layer 234. A stamp 55 can be used to imprint the structures 84. The structures 84 can be sized and shaped to reduce reflection of incident light, to increase heat transfer away from the polarizer, or both. For example, the structures 84 can be shaped like ribs or pillars to increase surface area for heat transfer, to reduce reflection, or both.

As illustrated in FIG. 24, another step 240 in the fourth method can include curing (i.e. causing a chemical reaction in) the uncured backside layer 234 to form a cured backside layer 244. Characteristics of the uncured backside layer 234, characteristics of the cured backside layer 244, and curing are described below in the Added Features Applicable to All Methods section. Step 240 can follow step 230.

A polarizer made from the fourth method can have some or all of the following characteristics: a high percent transmission of one polarization, ability to endure a high temperature due to the imprinted structures 84, and relatively easy to manufacture.

Fifth Method—Thin Films 251/261

As illustrated in FIGS. 25-35, a fifth method of making a polarizer can comprise some or all of the following steps, which can be performed in the following order. There may be additional steps not described below. These additional steps may be before, between, or after those described.

As illustrated in FIGS. 25, 29, and 33, the method can comprise applying an uncured thin film 251 on a substrate 11. As illustrated in FIGS. 26, 30, and 34, another step in the fifth method can include curing (i.e. causing a chemical reaction in) the uncured thin film 251 to form a cured thin film 261. Characteristics of the uncured thin film 251, characteristics of the cured thin film 261, and curing are described below in the Added Features Applicable to All Methods section.

As illustrated in FIGS. 27 and 33, the method can further comprise applying a reflective thin film 272 on the substrate 11. As illustrated in FIGS. 28a, 28b, 31, 32, and 35, the method can also include etching the reflective thin film, and also etching the cured thin film(s) 261 in some embodiments, to form polarization structures 12.

As illustrated in FIG. 25, the uncured thin film 251 can be a lower uncured thin film $251_L$ applied on the substrate 11 before applying the reflective thin film 272. As illustrated in FIG. 26, the lower uncured thin film $251_L$ can be cured to form a lower cured thin film 261. As illustrated in FIG. 27, the reflective thin film 272 can be applied on the lower cured thin film 261. As illustrated in FIG. 28a, the reflective thin film 272 can be etched to form polarization structures 12, which can consist of reflective thin film polarization structures 282.

As illustrated in FIG. 28b, the lower cured thin film $261_L$ and the reflective thin film 272 can be etched to form polarization structures 12 including reflective thin film polarization structures 282 and lower cured thin film polarization structures $281_L$. The lower cured thin film polarization structures $281_L$ can be sandwiched between the reflective thin film polarization structures 282 and the substrate 11. Each lower cured thin film polarization structure $281_L$ can be aligned with a corresponding reflective thin film polarization structure 282.

As illustrated in FIG. 29, step 290 can follow step 270, and an upper uncured thin film $251_U$ can be applied on the reflective thin film 272. As illustrated in FIG. 30, the upper uncured thin film $251_U$ can be cured to form an upper cured thin film $261_U$. As illustrated in FIG. 31, the upper cured thin film $261_U$ and the reflective thin film 272 can be etched to form polarization structures 12 including upper cured thin film polarization structures $281_U$ and reflective thin film polarization structures 282. As illustrated in FIG. 32, the upper cured thin film $261_U$, the reflective thin film 272, and the lower cured thin film $261_L$ can be etched to form polarization structures 12 including upper cured thin film polarization structures $281_U$, reflective thin film polarization structures 282, and lower cured thin film polarization structures $281_L$. The reflective thin film polarization structures 282 can be sandwiched between the upper cured thin film polarization structures $281_U$ and the lower cured thin film polarization structures $281_L$. Each lower cured thin film polarization structure $281_L$, reflective thin film polarization structure 282, and upper cured thin film polarization structure $281_U$ can be aligned together.

As illustrated in FIG. 33, the uncured thin film 251 can be an upper uncured thin film $251_U$ and the reflective thin film 272 can be applied on the substrate 11 before applying the upper uncured thin film $251_U$. As illustrated in FIG. 34, the upper uncured thin film $251_U$ can be cured to form an upper cured thin film $261_U$. As illustrated in FIG. 35, the upper cured thin film $261_U$ and the reflective thin film 272 can be etched to form polarization structures 12 including upper cured thin film polarization structures $281_U$ and reflective thin film polarization structures 282. The reflective thin film polarization structures 282 can be sandwiched between the upper cured thin film polarization structures $281_U$ and the substrate 11. Each upper cured thin film polarization structure $281_U$ can be aligned with a corresponding reflective thin film polarization structure 282.

Added Features Applicable to All Methods

In the following discussion, the uncured cover layer 34, the uncured fill layer 134, the uncured imprintable layer 184, the uncured backside layer 234, the uncured thin film(s) 251 will be referred to as an uncured layer. In the following discussion, the cured cover layer 44, the cured fill layer 144, the cured printed layer 204, the cured backside layer 244, and the cured thin film(s) 261 will be referred to as a cured layer.

In one aspect, the uncured layer can be a liquid with solid inorganic nanoparticles dispersed throughout a continuous phase. Curing, or causing a chemical reaction in, the uncured layer can include forming the uncured layer into a solid, interconnecting network of the inorganic nanoparticles, defining a cured layer.

In another aspect, the uncured layer can be a colloidal suspension including a dispersed phase and a continuous phase. Curing, or causing a chemical reaction in, the colloidal suspension can include removing the continuous phase to form a solid, defining the cured layer. The solid can be inorganic.

The inorganic nanoparticles, the dispersed phase, or both can include some metal atoms bonded to organic moieties. In one aspect, each metal atom can be bonded to no more than one organic moiety. Examples of the organic moieties include —$CH_3$ and —$CH_2CH_3$. Consequently, the cured layer can include embedded organic moieties. These embedded organic moieties can be useful for changing properties of the cured layer, such as changing its optical properties and hardness.

In another embodiment, the uncured layer can be a solution including molecules in a solvent. The solvent can include water and an organic liquid. The molecules can include metal atoms bonded to reactive groups $R^1$. Each reactive-group can be, independently, —Cl, —$OR^2$, —$OCOR^2$, or —$N(R^2)_2$, where $R^2$ is an alkyl group. The alkyl group has at least one carbon atom, but can be small, such as for example with ≤2 carbon atoms, ≤3 carbon atoms, ≤5 carbon atoms, or ≤carbon atoms. For example, the alkyl group can be —$CH_3$ or —$CH_2CH_3$. The solid inorganic nanoparticles referred to above can include the metal atoms described in this paragraph.

In certain embodiments, all bonds, or all except one of the bonds, of each of the metal atoms, can be to these reactive groups. For example, these molecules can be $(CH_3)Si(R^1)_3$, $Si(R^1)_4$, $Al(R^1)_3$, $(CH_3)Al(R^1)_2$, $(CH_3)Ti(R^1)_3$, $Ti(R^1)_4$, or combinations thereof. Curing, or causing a chemical reaction in, the solution can include reacting the molecules to form a solid, defining the cured layer, with the metal atoms interconnected with each other. The solid can be inorganic. In one embodiment, the molecules can have a relatively small molecular weight, such as for example ≥70 g/mol, ≥80 g/mol, ≥90 g/mol, ≥100 g/mol, or ≥110 g/mol and ≤125 g/mol, ≤150 g/mol, ≤175 g/mol, or ≤200 g/mol.

Forming the uncured layer into the cured layer can include evaporation of at least some liquid. In one embodiment, all liquid initially in the uncured layer either reacts to form a solid (the cured layer) or is evaporated. Forming the uncured layer into the cured layer can include use of ultraviolet light, heat or both. Integrity of the cured layer can be improved by curing at a relatively low temperature, such as for example ≥30° C., ≥50° C., or ≥100° C. and ≤150° C., ≤200° C., ≤250° C., or ≤300° C.

The uncured layer, the cured layer, or both can have a low index of refraction for improved optical performance. This can be particularly beneficial for embodiments with cured layer in the channels 13 between the polarization structures 12. For example, the index of refraction of uncured layer, the cured layer, or both can be ≤1.1, ≤1.2, ≤1.3, or ≤1.4. In one embodiment, the index of refraction of uncured layer, the cured layer, or both can be ≥1.0.

One way of achieving this low index of refraction is to include small voids or cavities in the cured layer. These small voids, filled with air, lower the overall index of refraction of the cured layer. For example, the cured layer can include silicon dioxide, with an index of refraction of around 1.4-1.5, but with the voids, the overall index of refraction can be <1.4. These voids can be formed by use of a solvent in the uncured layer which has larger molecules. For example, a solvent in the uncured layer can have a molecular weight of ≥70 g/mol, ≥80 g/mol, ≥90 g/mol, ≥100 g/mol, or ≥110 g/mol. As another example, a chemical in this solvent can have a large number of atoms, such as for example ≥15 atoms, ≥20 atoms, or ≥25 atoms. It can be a consideration for this solvent to not have too high of a molecular weight so that it can be sufficiently volatile. Therefore, this solvent can have a molecular weight of ≤125 g/mol, ≤150 g/mol, ≤175 g/mol, ≤200 g/mol, or ≤300 g/mol. This solvent can also have ≤30 atoms, ≤50 atoms, or ≤75 atoms. Further, this solvent can have a structure which occupies larger space, such as an aryl molecule or otherwise a molecule with double bonds. For example, the uncured layer can include benzene or xylene.

The inorganic nanoparticles, solid resulting from removing the continuous phase, and the metal atoms noted above can comprise aluminum, titanium, silicon, germanium, tin, lead, zirconium, or combinations thereof. The cured layer can include aluminum oxide, titanium oxide, silicon oxide, germanium oxide, tin oxide, lead oxide, zirconium oxide, or combinations thereof. Aluminum oxide can be particularly useful if a major function of the cured layer is heat transfer away from the polarization structures 12. Silicon dioxide can be particularly useful due to its low index of refraction. Titanium dioxide can be particularly useful due to its high index of refraction.

The inorganic nanoparticles can be sized for keeping them out of the channels 13. For example ≥90%, ≥95%, or ≥99% of the inorganic nanoparticles can have a diameter of ≥1 nm, ≥10 nm, or ≥50 nm. Alternatively, the inorganic nanoparticles can be sized for optimal filling the channels 13. For example ≥90%, ≥95%, or ≥99% of the inorganic nanoparticles can have a diameter of ≤2 nm, ≤1 nm, or ≤0.5 nm.

As illustrated in FIGS. 7-9, 13-15, 18-20, and 22-24, and as described above, the method can include imprinting a pattern of structures. As illustrated in FIG. 36, such imprinting can also include step 360, imprinting separate pixels. Although FIG. 36 shows different pixels with different wire direction with respect to each other, the pixels can differ in other ways with respect to each other.

As illustrated in FIGS. 37-38, any of the methods above can further comprise sputter deposition of a thin film 375 onto the uncured layer, the cured layer, or both, represented by reference numbers 374 and 384, respectively. The thin film 375 can be any material with desired optical properties, properties for protection of the polarizer, or both. The thin film 265 can be a dielectric. Sputter deposition of the thin film 375 can reduce voids in the uncured layer 374, the cured layer 384, or both; therefore this sputter deposition step is particularly useful for embodiments in which it is desirable for the uncured layer 374 and the cured layer 384 to fill the channels 13.

The following can be used to improve applying the uncured layer, and forming the uncured layer into the cured layer, in any of the methods described above. The following steps can be performed in the following order: spin coating an uncured layer onto the polarization device or substrate 11, defining a first spin coat; baking the polarizer or coated substrate 11, defining a first bake; spin coating an uncured layer onto the first spin coat, defining a second spin coat; then baking the polarizer or coated substrate 11, defining a second bake. The spin coating and baking steps can be repeated a third time, a fourth time, or more times. Uniformity of cured layer can be improved by multiple repeats of these spin coating and baking steps, but cost also increases with each repeat. Therefore, uniformity specifications can be weighed against cost in deciding the number of repeats, if any.

Time of each spin coat depends on desired thickness and on the spin coater. Example times include ≥2 seconds, ≥4 seconds, or ≥6 seconds and ≤10 seconds, ≤20 seconds, or ≤30 seconds for each spin coat.

Examples of speed of the first spin coat, the second spin coat, or additional spin coatings include ≥100 rpm, ≥500 rpm, ≥1000 rpm, or ≥1500 rpm and ≤2500 rpm, ≤3000 rpm, ≤4000 rpm, or ≤8000 rpm. Examples of temperature of the first bake, the second bake, or other bakes include ≥30° C., ≥50° C., ≥100° C., or ≤150° C. and ≤250° C., ≤300° C., or ≤400° C.

The uncured layer, the cured layer, or both can be relatively thick by the chemistry and methods of application described herein. For example, an average thickness Th of the layer, minimum thickness $Th_{min}$ of the layer, maximum thickness $Th_{max}$ of the layer can have the following values as specified in the claims: ≥10 nm, ≥50 nm, ≥100 nm, ≥200 nm and ≤300 nm, ≤600 nm, or ≤1000 nm.

The methods can be combined. For example, the overcoat layer 14 and the cured cover layer 44 can be applied on the polarizers shown in FIG. 10a-15 or 18-35 and as described above. The cured fill layer 144 can be formed on top of the polarization structures 12 and extending into channels 13 between the polarization structures 12 shown in FIGS. 18-21 and 25-35 and as described above. The cured backside layer 244 can be formed on the second side $11_s$ of the substrate 11 of any of the polarizers described herein, as shown in FIGS. 22-24 and as described above. The cured thin film(s) 251, the cured thin film polarization structures 281, or both can be used with the any of the polarizers shown in the figures and described herein.

What is claimed is:

1. A method of making a polarizer, the method comprising:
   providing a substrate that is transparent;
   applying an uncured imprintable layer on a first side of the substrate, the uncured imprintable layer being a liquid with solid inorganic nanoparticles dispersed throughout a continuous phase;
   imprinting a pattern of polarization structures in the uncured imprintable layer; wherein a longitudinal dimension of some of the polarization structures extend in a first direction, a longitudinal dimension of other of the polarization structures extend in a second direction, the first direction and the second direction are parallel to the first side of the substrate, and the first direction is a different direction from the second direction;
   curing the uncured imprintable layer into a cured printed layer, the cured printed layer including a solid, interconnecting network of the inorganic nanoparticles;
   applying an uncured fill layer on top of the polarization structures and extending into channels between the polarization structures, the uncured fill layer being a liquid with solid inorganic nanoparticles dispersed throughout a continuous phase, chemistry of the uncured fill layer and chemistry of a surface of the polarization structures are attractive to each other; and
   curing the uncured fill layer to form a cured fill layer, the cured fill layer including a solid, interconnecting network of the inorganic nanoparticles.

2. The method of claim 1, wherein a width of at least some of the polarization structures extending in the first direction and a width of at least some of the polarization structures extending in the second direction is ≤5500 nm, the width being perpendicular to the longitudinal dimension and parallel to the first side of the substrate.

3. The method of claim 1, wherein the substrate and the polarization structures are dielectric.

4. The method of claim 1, wherein the first direction is perpendicular to the second direction.

5. The method of claim 1, wherein the polarization structures have ≥three different thicknesses, the thicknesses being a dimension perpendicular to the first side of the substrate.

6. The method of claim 1, wherein the substrate has a second side opposite of the first side, the method further comprising:
   applying an uncured backside layer to the second side of the substrate, the uncured backside layer being a liquid with solid inorganic nanoparticles dispersed throughout a continuous phase; and
   curing the uncured backside layer to form a cured backside layer, the cured backside layer including a solid, interconnecting network of the inorganic nanoparticles.

7. A method of making a polarizer, the method comprising:
   providing a substrate that is transparent;
   applying an uncured imprintable layer on a first side of the substrate, the uncured imprintable layer being a liquid with solid inorganic nanoparticles dispersed throughout a continuous phase;
   imprinting a pattern of polarization structures in the uncured imprintable layer; wherein a longitudinal dimension of some of the polarization structures extend in a first direction, a longitudinal dimension of other of the polarization structures extend in a second direction, the first direction and the second direction are parallel to the first side of the substrate, and the first direction is a different direction from the second direction;
   curing the uncured imprintable layer into a cured printed layer, the cured printed layer including a solid, interconnecting network of the inorganic nanoparticles;
   applying an overcoat layer on the cured printed layer;
   applying an uncured cover layer to an outer surface of the overcoat layer farthest from the substrate, the uncured cover layer being a liquid with solid inorganic nanoparticles dispersed throughout a continuous phase, chemistry of the uncured cover layer and chemistry of the outer surface of the overcoat layer are repellant with respect to each other; and
   curing the uncured cover layer to form a cured cover layer, the cured cover layer including a solid, interconnecting network of the inorganic nanoparticles.

8. The method of claim 1, wherein imprinting the pattern of polarization structures includes imprinting separate pixels.

9. The method of claim 1, further comprising:
   placing a second substrate onto the uncured fill layer.

10. A method of making a polarizer, the method comprising:
    providing a substrate that is transparent;
    applying an uncured imprintable layer on a first side of the substrate, the uncured imprintable layer being a solution including molecules in a solvent, the solvent including water and an organic liquid, the molecules including metal atoms bonded to reactive groups, where each reactive-group is independently —Cl, —$OR^2$, —$OCOR^2$, or —$N(R^2)_2$, and $R^2$ is an alkyl group;
    imprinting a pattern of polarization structures in the uncured imprintable layer; wherein a longitudinal dimension of some of the polarization structures extend in a first direction, a longitudinal dimension of other of the polarization structures extend in a second direction, the first direction and the second direction are parallel to the first side of the substrate, and the first direction is a different direction from the second direction;

reacting the molecules to form a solid of the metal atoms interconnected with each other, defining a cured printed layer;

applying an uncured fill layer on top of the polarization structures and extending into channels between the polarization structures, the uncured fill layer being a solution including molecules in a solvent, the solvent including water and an organic liquid, the molecules including metal atoms bonded to reactive groups, where each reactive-group is independently —Cl, —$OR^2$, —$OCOR^2$, or —$N(R^2)_2$, and $R^2$ is an alkyl group, chemistry of the uncured fill layer and chemistry of a surface of the polarization structures are attractive to each other; and reacting the molecules to form a solid of the metal atoms interconnected with each other, defining a cured fill layer.

11. The method of claim 10, further comprising placing a second substrate on the uncured fill layer.

12. The method of claim 10, wherein every bond of the metal atoms is bonded, independently, to one the reactive groups.

13. The method of claim 10, wherein the metal atoms include $Si(R^1)_4$, $Al(R^1)_3$, $Ti(R^1)_4$, or combinations thereof, where each $R^1$ is, independently, one of the reactive groups.

14. The method of claim 10, wherein the molecules have a molecular weight of ≥80 g/mol and ≤150 g/mol.

15. The method of claim 10, wherein imprinting the pattern of polarization structures includes imprinting separate pixels.

16. The method of claim 7, wherein imprinting the pattern of polarization structures includes imprinting separate pixels.

17. The method of claim 7, further comprising placing a second substrate onto the uncured cover layer.

18. The method of claim 7, wherein:
the substrate and the polarization structures are dielectric;
the polarization structures have ≥three different thicknesses, the thicknesses being a dimension perpendicular to the first side of the substrate; and
the polarizer can transmit ≥50% of incident light as a single polarization.

19. The method of claim 18, wherein the polarizer can transmit ≥60% of incident light as a single polarization.

20. The method of claim 10, wherein:
the substrate and the polarization structures are dielectric;
the polarization structures have ≥three different thicknesses, the thicknesses being a dimension perpendicular to the first side of the substrate; and
the polarizer can transmit ≥50% of incident light as a single polarization.

* * * * *